United States Patent

Asami

(10) Patent No.: US 10,096,718 B2
(45) Date of Patent: Oct. 9, 2018

(54) TRANSISTOR, ELECTRONIC DEVICE, MANUFACTURING METHOD OF TRANSISTOR

(71) Applicant: Semiconductor Energy Laboratory Co., Ltd., Atsugi-shi, Kanagawa-ken (JP)

(72) Inventor: Yoshinobu Asami, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/616,982

(22) Filed: Jun. 8, 2017

(65) Prior Publication Data

US 2017/0365720 A1   Dec. 21, 2017

(30) Foreign Application Priority Data

Jun. 17, 2016  (JP) ................... 2016-120670

(51) Int. Cl.
*H01L 29/66*    (2006.01)
*H01L 29/792*   (2006.01)
(Continued)

(52) U.S. Cl.
CPC .... *H01L 29/78648* (2013.01); *H01L 27/1052* (2013.01); *H01L 29/42328* (2013.01);
(Continued)

(58) Field of Classification Search
CPC .......... H01L 29/786–29/78696; H01L 29/458; H01L 29/41733; H01L 29/4908;
(Continued)

(56) References Cited

U.S. PATENT DOCUMENTS 5,929,479 A * 7/1999 Oyama ................. H01L 27/115
                                                 257/314
7,786,526 B2  8/2010 Takano et al.
(Continued)

FOREIGN PATENT DOCUMENTS

JP  2012-023359 A  2/2012
JP  2012-146965 A  8/2012
(Continued)

OTHER PUBLICATIONS

Asami.Y et al., "Properties of c-axis-aligned crystalline indium-gallium-zinc oxide field-effect transistors fabricated through a tapered-trench gate process", Jpn. J. Appl. Phys. (Japanese Journal of Applied Physics), Mar. 22, 2016, vol. 55, pp. 04EG09-1-04EG09-6.

*Primary Examiner* — Natalia Gondarenko
(74) *Attorney, Agent, or Firm* — Robinson Intellectual Property Law Office; Eric J. Robinson

(57) ABSTRACT

Reducing the power consumption of a transistor and stably controlling its threshold value. Providing a transistor comprising a first conductive layer, a first insulating layer and a second insulating layer over the first conductive layer, a semiconductor layer over the first insulating layer, a third insulating layer over the first conductive layer and the semiconductor layer, a second conductive layer over the second insulating layer, and a gate electrode over the third insulating layer. The first conductive layer is in an electrically floating state. The first conductive layer has a region overlapping with the semiconductor layer with the first insulating layer provided therebetween, a region overlapping with the second conductive layer with the second insulating layer provided therebetween, and a region overlapping with the gate electrode with the third insulating layer provided therebetween.

14 Claims, 22 Drawing Sheets

(51) Int. Cl.
*H01L 27/115* (2017.01)
*H01L 29/786* (2006.01)
*H01L 27/105* (2006.01)
*H01L 29/423* (2006.01)
*H01L 29/788* (2006.01)
H01L 21/336 (2006.01)
H01L 21/8239 (2006.01)
H01L 21/8247 (2006.01)

(52) U.S. Cl.
CPC .. *H01L 29/42384* (2013.01); *H01L 29/66969* (2013.01); *H01L 29/7869* (2013.01); *H01L 29/7883* (2013.01)

(58) Field of Classification Search
CPC .. H01L 29/42384–29/42392; H01L 29/78648; H01L 29/66969; H01L 29/7883; H01L 27/1052; H01L 27/11517; H01L 27/11541; H01L 27/1156; H01L 29/788; H01L 2029/42388; H01L 29/42332; H01L 29/66825; H01L 29/42324; H01L 29/7881; H01L 29/42328; H01L 29/792; H01L 29/4232; H01L 29/7887; H01L 29/2376; H01L 29/4234; H01L 29/511; H01L 29/78615; H01L 29/7869; H01L 29/785; H01L 27/115; H01L 27/11556; H01L 27/11558; H01L 27/11568; H01L 21/28282
USPC ......... 257/43, 314–317, 239, 261, 318, 319, 257/321, 331, 36, E27.103, E21.209, 257/E21.422, E29.129, E29.3, E21.179, 257/E21.681, E21.19, E21.423, E21.645, 257/E21.68, E21.693, E29.309, E29.304, 257/E29.154, E29.241; 438/257, 261, 438/197, 264, 594, 211
See application file for complete search history.

(56) References Cited

U.S. PATENT DOCUMENTS

| | | | |
|---|---|---|---|
| 7,968,932 B2 | 6/2011 | Asami | |
| 8,022,460 B2 | 9/2011 | Yamazaki et al. | |
| 8,188,535 B2 | 5/2012 | Asami | |
| 8,193,574 B2 | 6/2012 | Asami | |
| 8,198,666 B2 | 6/2012 | Asami et al. | |
| 8,252,643 B2 | 8/2012 | Asami | |
| 8,421,068 B2 | 4/2013 | Yamazaki et al. | |
| 8,421,069 B2 | 4/2013 | Yamazaki et al. | |
| 8,547,771 B2 | 10/2013 | Koyama | |
| 8,629,490 B2 | 1/2014 | Asami | |
| 8,729,620 B2 | 5/2014 | Yamazaki et al. | |
| 8,872,251 B2 | 10/2014 | Asami | |
| 8,916,865 B2 | 12/2014 | Yamazaki | |
| 8,995,174 B2 | 3/2015 | Koyama | |
| 9,024,317 B2 | 5/2015 | Endo et al. | |
| 9,590,112 B2 | 3/2017 | Yamazaki | |
| 9,660,100 B2 | 5/2017 | Okazaki | |
| 9,666,678 B2 | 5/2017 | Yamazaki et al. | |
| 9,673,337 B2 | 6/2017 | Yamazaki et al. | |
| 2011/0176354 A1* | 7/2011 | Yamazaki | G11C 5/063 365/149 |
| 2011/0180796 A1* | 7/2011 | Yamazaki | H01L 29/7869 257/57 |
| 2012/0001167 A1* | 1/2012 | Morosawa | H01L 29/7869 257/43 |
| 2015/0171117 A1 | 6/2015 | Endo et al. | |
| 2015/0280691 A1 | 10/2015 | Koyama | |
| 2015/0372009 A1 | 12/2015 | Yamazaki | |
| 2016/0218219 A1 | 7/2016 | Asami et al. | |
| 2016/0218225 A1 | 7/2016 | Yamazaki | |
| 2016/0233340 A1 | 8/2016 | Shimomura et al. | |
| 2016/0240684 A1 | 8/2016 | Yamazaki et al. | |
| 2016/0268436 A1 | 9/2016 | Asami | |
| 2017/0092776 A1 | 3/2017 | Yamazaki et al. | |
| 2017/0338351 A1* | 11/2017 | Zhou | H01L 29/78609 |

FOREIGN PATENT DOCUMENTS

| | | |
|---|---|---|
| JP | 2012-257187 A | 12/2012 |
| JP | 2013-247143 A | 12/2013 |

* cited by examiner

TRANSISTOR, ELECTRONIC DEVICE, MANUFACTURING METHOD OF TRANSISTOR

BACKGROUND OF THE INVENTION

1. Field of the Invention

One embodiment of the present invention relates to a transistor and an electronic device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, an imaging device, a memory device, a method for driving any of them, and a method for manufacturing any of them.

2. Description of the Related Art

A technique in which a transistor is formed using a semiconductor thin film has attracted attention. The transistor is applied to a wide range of electronic devices such as an integrated circuit (IC) or an image display device (also simply referred to as a display device). Even though a silicon-based semiconductor material is widely known as a material for a semiconductor thin film applicable to a transistor, an oxide semiconductor has attracted attention in recent years.

It is also known that a transistor formed using an oxide semiconductor has an extremely low leakage current in an off state. For example, a low-power-consumption CPU and the like utilizing a characteristic of low leakage current of the transistor including an oxide semiconductor has been disclosed (see Patent Document 1).

Furthermore, a technology has been disclosed in which gate electrodes of a transistor using an oxide semiconductor are formed over and under the oxide semiconductor and the threshold value of the transistor is controlled using one of the gate electrodes (see Patent Documents 2 and 3).

REFERENCE

Patent Documents

[Patent Document 1] Japanese Published Patent Application No. 2012-257187
[Patent Document 2] Japanese Published Patent Application No. 2012-23359
[Patent Document 3] Japanese Published Patent Application No. 2012-146965

SUMMARY OF THE INVENTION

An object of one embodiment of the present invention is to reduce power consumption of a transistor. Another object of one embodiment of the present invention is to stably control the threshold value of a transistor.

Another object of one embodiment of the present invention is to provide a novel transistor structure and a manufacturing method thereof.

The objects of one embodiment of the present invention are not limited to the above-described objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention solves at least one of the aforementioned objects and/or one of the other objects.

One embodiment of the present invention is a transistor including a first conductive layer, a first insulating layer and a second insulating layer over the first conductive layer, a semiconductor layer over the first insulating layer, a third insulating layer over the first conductive layer and the semiconductor layer, a second conductive layer over the second insulating layer, and a gate electrode over the third insulating layer. The first conductive layer is in an electrically floating state. The first conductive layer has a region overlapping with the semiconductor layer with the first insulating layer provided therebetween, a region overlapping with the second conductive layer with the second insulating layer provided therebetween, and a region overlapping with the gate electrode with the third insulating layer provided therebetween.

In the transistor with the above structure, the first conductive layer preferably functions as a floating gate and the second conductive layer preferably functions as a control gate.

In the transistor with any of the above structures, a thickness of the third insulating layer is preferably smaller than a thickness of the first insulating layer.

In the transistor with any of the above structures, a fourth insulating layer over the first insulating layer and a fourth conductive layer over the fourth insulating layer are preferably included.

In the transistor with the above structure, a thickness of the fourth insulating layer is preferably smaller than a thickness of the first insulating layer.

In the transistor with any of the above structures, a thickness of the second insulating layer is preferably smaller than a thickness of the first insulating layer.

In the transistor with any of the above structures, the semiconductor layer preferably contains an oxide semiconductor.

Another embodiment of the present invention is an electronic device including a transistor with any of the above structures and an antenna, a battery, an operation switch, a microphone, or a speaker.

Another embodiment of the present invention is a method for manufacturing a transistor including a first conductive layer, a first insulating layer and a second insulating layer over the first conductive layer, a semiconductor layer over the first insulating layer, a third insulating layer over the first conductive layer and the semiconductor layer, a second conductive layer over the second insulating layer, and a gate electrode over the third insulating layer. The first conductive layer is in an electrically floating state. The first conductive layer has a region overlapping with the semiconductor layer with the first insulating layer provided therebetween, a region overlapping with the second conductive layer with the second insulating layer provided therebetween, and a region overlapping with the gate electrode with the third insulating layer provided therebetween. A charge is injected into the first conductive layer by application of a voltage between the second conductive layer and the gate electrode.

One embodiment of the present invention can reduce power consumption of a transistor. Another embodiment of the present invention can stably control the threshold voltage of a transistor.

Another embodiment of the present invention can provide a novel transistor structure and a manufacturing method thereof.

Note that the effects of one embodiment of the present invention are not limited to the above-described effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the aforementioned effects and/or the other effects. Accordingly, one embodiment of the present invention does not have the aforementioned effects in some cases.

DETAILED DESCRIPTION OF THE INVENTION

Figure 1A:
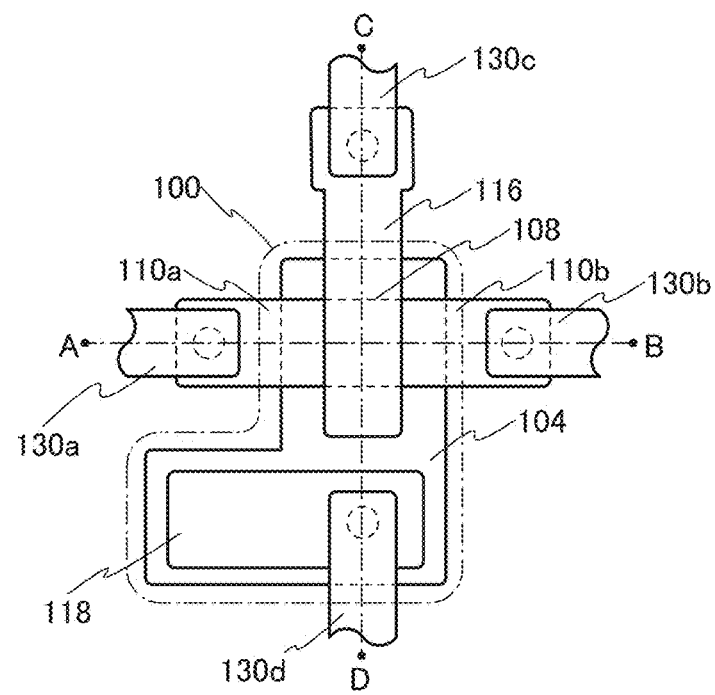
FIGS. 1A to 1C are a top view and cross-sectional views illustrating a transistor of one embodiment of the present invention.

Embodiments will be described in detail with reference to the drawings. Note that one embodiment of the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments and example. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, or the like as disclosed in the drawings and the like. For example, in the actual manufacturing process, a layer, a resist mask, or the like might be unintentionally reduced in size by treatment such as etching, which is not illustrated in some cases for easy understanding.

Especially in a top view (also referred to as a "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. Moreover, a term with an ordinal number in this specification and the like might not be provided with any ordinal number in a claim.

In addition, in this specification and the like, a term such as "electrode" or "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly above" or "directly below" and "directly in contact with" another component. For example, the expression "electrode B over insulating layer A" does not necessarily mean that the electrode B is above and in direct contact with the insulating layer A and can include the case where another component is provided between the insulating layer A and the electrode B.

Functions of a source and a drain might be switched depending on operation conditions, for example, when a transistor having opposite polarity is employed or when the direction of current flow is changed in circuit operation. Thus, it is difficult to define which is the source or the drain. Accordingly, the terms "source" and "drain" can be switched in this specification.

Furthermore, in this specification and the like, an explicit description like "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Note that in this specification and the like, the expression "electrically connected" includes the case where components are connected through an object having any electric function. There is no particular limitation on the "object having any electric function" as long as electric signals can be transmitted and received between components that are connected through the object. Accordingly, even when the expression "electrically connected" is used in this specification, in an actual circuit, there is a case in which no physical connection is made and a wiring is just extended in an actual circuit.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering side surfaces of a semiconductor, the proportion of a channel formation region formed in the side surfaces of the semiconductor is increased in some cases. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, an apparent channel width is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

Note that an impurity in a semiconductor refers to, for example, elements other than the main components of a semiconductor. For example, an element with a concentration lower than 0.1 atomic % can be regarded as an impurity. Inclusion of impurities may cause an increase in density of states (DOS) in a semiconductor, and/or a decrease in the carrier mobility or the crystallinity. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. In the case of an oxide semiconductor, water also serves as an impurity in some cases. In the case of an oxide semiconductor, oxygen vacancies may be formed by entry of impurities. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The terms "perpendicular" and "orthogonal" indicate that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

In the specification and the like, the terms "identical", "the same", "equal", "uniform", and the like (including synonyms thereof) used in describing calculation values and actual measurement values allow for a margin of error of ±20% unless otherwise specified.

In this specification and the like, in the case where an etching step (removal step) is performed after a resist mask is formed in a photolithography method, the resist mask is removed after the etching step, unless otherwise specified.

In this specification and the like, a high power supply potential VDD (also referred to as VDD or H potential) is a power supply potential higher than a low power supply potential VSS. The low power supply potential VSS (also referred to as VSS or L potential) is a power supply potential lower than the high power supply potential VDD. A ground potential (also referred to as GND or GND potential) can be used as VDD or VSS. For example, in the case where a ground potential is used as VDD, VSS is lower than the ground potential, and in the case where a ground potential is used as VSS, VDD is higher than the ground potential.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Furthermore, unless otherwise specified, a transistor described in this specification and the like is an enhancement-type (normally-off-type) field effect transistor. Unless otherwise specified, a transistor described in this specification and the like refers to an n-channel transistor. Thus, unless otherwise specified, the threshold voltage (also referred to as "Vth") is larger than 0 V.

(Embodiment 1)

In this embodiment, a transistor of one embodiment of the present invention will be described with reference to FIGS. 1A to 1C, FIGS. 2A to 2C, FIGS. 3A to 3C, FIGS. 4A to 4E, FIGS. 5A to 5C, FIGS. 6A to 6C, FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, FIGS. 14A to 14E, FIGS. 15A to 15C, and FIGS. 16A to 16C.

<Structure of Transistor 100>

Figure 1B:
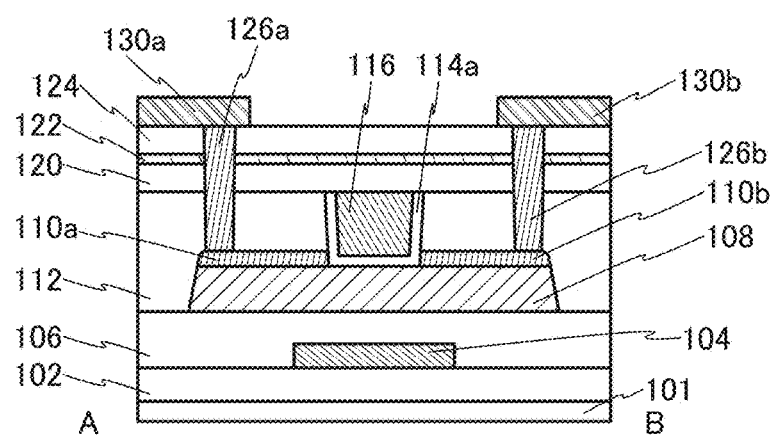
Figure 1C:
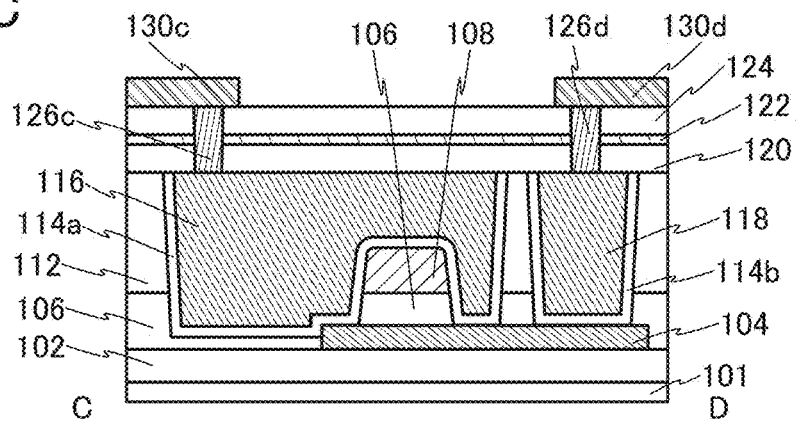

A transistor 100, which has a basic structure of one embodiment of the present invention, will be described with reference to FIGS. 1A to 1C. FIG. 1A is a top view of a semiconductor device including the transistor 100. FIG. 1B shows a cross-section of the semiconductor device taken along the dashed-dotted line A-B in FIG. 1A. Furthermore, FIG. 1C shows a cross-section of the semiconductor device taken along the dashed-dotted line C-D in FIG. 1A. Note that in the transistor 100, a direction from a point C to a point D indicated by the dashed-dotted line C-D is referred to as a channel width direction and a direction from a point A to a point B indicated by the dashed-dotted line A-B is referred to a channel length direction.

The transistor 100 is provided over an insulating layer 102 over a substrate 101. The transistor 100 includes a conductive layer 104, an insulating layer 106, a semiconductor layer 108, a conductive layer 110a, a conductive layer 110b, an insulating layer 112, an insulating layer 114a, an insulating layer 114b, a conductive layer 116, and a conductive layer 118. Furthermore, an insulating layer 120, an insulating layer 122, an insulating layer 124, conductive layers 126a to 126d, and conductive layers 130a to 130d are provided over the transistor 100.

In the transistor 100, the conductive layer 104 is provided between the insulating layer 102 and the insulating layer 106. The insulating layer 106 has an island-shaped projection, and the semiconductor layer 108 is provided over the projection. The conductive layers 110a and 110b are provided in contact with part of a top surface of the semiconductor layer 108.

The insulating layer 114a is provided in contact with another part of the top surface of the semiconductor layer 108 and part of a side surface of the semiconductor layer 108. Furthermore, in the manufacturing process of the transistor 100, the insulating layer 114a is formed after part of the conductive layer 104 and part of the insulating layer 106 have been exposed. Thus, the insulating layer 114a is in contact with the conductive layer 104 and the insulating layer 106.

The conductive layer 116 has a region overlapping with the conductive layer 104 with the insulating layer 114a provided therebetween and a region overlapping with the conductive layer 104 with the insulating layer 114a, the semiconductor layer 108, and the insulating layer 106 provided therebetween.

The insulating layer 114b is provided over the conductive layer 104 and in such a way that the insulating layer 114b does not overlap with the semiconductor layer 108. The conductive layer 118 is provided to overlap with the conductive layer 104 with the insulating layer 114b provided therebetween. Furthermore, the insulating layer 112 is provided over the insulating layer 106.

The insulating layer 114a and the insulating layer 114b are formed at the same time in the manufacturing process of the transistor 100. Each thickness of the insulating layer 114a and the insulating layer 114b is preferably smaller than a thickness of the insulating layer 106. Specifically, each thickness of the insulating layer 114a and the insulating layer 114b is preferably greater than or equal to 1 nm and less than or equal to 20 nm, and more preferably greater than or equal to 8 nm and less than or equal to 10 nm. In FIG. 1C, the insulating layer 114a and the insulating layer 114b are separated from each other; however, the insulating layer 114a may be connected to the insulating layer 114b.

The insulating layer 120, the insulating layer 122, and the insulating layer 124 are provided to overlap in this order over the transistor 100.

The conductive layers 130a to 130d are provided over the insulating layer 124. The conductive layer 130a is electrically connected to the conductive layer 110a through the conductive layer 126a. The conductive layer 130b is electrically connected to the conductive layer 110b through the conductive layer 126b. The conductive layer 130c is electrically connected to the conductive layer 116 through the conductive layer 126c. The conductive layer 130d is electrically connected to the conductive layer 118 through the conductive layer 126d. Note that it can also be said that, in the transistor 100, a direction from the conductive layer 130c to the conductive layer 130d is the channel width direction and a direction from the conductive layer 130a to the conductive layer 130b is the channel length direction.

In the transistor 100, the conductive layer 110a and the conductive layer 110b function as a source electrode and a drain electrode. Furthermore, the conductive layer 104 is in an electrically floating state and has a function of holding a charge.

The conductive layer 116 functions as a gate electrode. Furthermore, the conductive layer 116 has a region overlapping with the conductive layer 104 with the insulating layer 114a provided therebetween. Additionally, the thickness of the insulating layer 114a is thin as described above.

Accordingly, charges can be injected from the conductive layer 116 into the conductive layer 104.

The conductive layer 118 has a region overlapping with the conductive layer 104 with the insulating layer 114b provided therebetween. Furthermore, the thickness of the insulating layer 114b is thin as described above. Accordingly, charges can be injected from the conductive layer 118 into the conductive layer 104.

Next, a method for controlling the threshold value of the transistor 100 using the conductive layer 104, the conductive layer 116, and the conductive layer 118 will be described. In the following description, the conductive layer 104 is referred to as a floating gate, the conductive layer 116 is referred to as a top gate, and the conductive layer 118 is referred to as a control gate for convenience.

Injection of carriers from the control gate into the floating gate is performed in a manner similar to that of injection of electrons into a floating gate in an operation of an electrically erasable programmable read only memory (EEPROM), which is a common nonvolatile memory. When the potential difference between the top gate and the control gate increases for a certain period of time, for example, the potential difference between the top gate and the floating gate as well as the potential difference between the control gate and the floating gate becomes larger. Thus, by making the potential difference between the top gate and the control gate sufficiently large, charges are injected from the top gate or the control gate into the floating gate through an insulating layer due to a Fowler-Nordheim (F-N) tunneling current. After the charges have been injected into the floating gate, even when the potential difference between the top gate and the control gate is made small, the floating gate holds the injected charges because the floating gate is in an electrically floating state. Furthermore, the potential of the floating gate can be controlled by the held charges. Additionally, the potential of the semiconductor layer can be changed by the potential of the floating gate. Thus, the threshold value of the transistor 100 can be changed by using the control gate and the floating gate.

When the threshold value of the transistor 100 is changed by applying a high voltage once between the conductive layer 116 (top gate) and the conductive layer 118 (control gate), the threshold value can be kept constant for a certain period of time afterwards, even when the potential difference between the conductive layer 116 and the conductive layer 118 becomes small. For example, even in the case where the potential of the conductive layer 118 is 0 V, the threshold value can be kept constant for a certain period of time. In other words, it is unnecessary to continuously apply a high voltage between the conductive layer 116 and the conductive layer 118, and for example, it is sufficient to apply a high voltage once before the semiconductor device including the transistor 100 leaves the factory or only when necessary during usage of the semiconductor device including the transistor 100. Thus, by providing the conductive layer 104 and the conductive layer 118, power necessary for controlling the threshold value of the transistor 100 can be reduced.

Furthermore, since the tunneling current flowing when the threshold value is changed by application of a high voltage between the conductive layer 116 and the conductive layer 118 is miniscule, the power necessary for controlling the threshold value of the transistor 100 can be reduced.

Furthermore, in manufacturing the transistor 100, since the insulating layers 114a and 114b and the conductive layers 104, 116, and 118 can be formed easily with a uniform quality, the threshold value can be stably controlled.

In the case where a charge stored in a floating gate is denoted by $Q_{FG}$, a capacitance between the floating gate and the top gate is denoted by $C_{FGTG}$, a capacitance between the floating gate and the control gate is denoted by $C_{FGCG}$, a capacitance between the floating gate and the semiconductor layer is denoted by $C_{FGOS}$, a potential of the top gate is 0, each potential of the source electrode and the drain electrode is 0, and a potential of the control gate is denoted by $V_C$, a potential $V_{FG}$ of the floating gate can be expressed through Formula (1).

$$V_{FG} = \frac{C_{FGCG}}{C_{FGTG}+C_{FGOS}+C_{FGCG}}\left(V_C + \frac{Q_{FG}}{C_{FGCG}}\right) \quad (1)$$

From Formula (1), it is found that the potential $V_{FG}$ of the floating gate can be controlled by the amount of charges $Q_{FG}$ stored in the floating gate. From Formula (1), it is found that $V_{FG}$ is proportional to $C_{FGCG}/(C_{FGTG}+C_{FGOS}+C_{FGCG})$. Note that $C_{FGCG}/(C_{FGTG}+C_{FGOS}+C_{FGCG})$ is sometimes referred to as coupling ratio.

$C_{FGCG}$ is proportional to an area (hereinafter referred to as $S_{FGCG}$) of a region where the conductive layer 104 (floating gate) and the conductive layer 118 (control gate) overlap. Furthermore, $C_{FGTG}$ is proportional to an area (hereinafter referred to as $S_{FGTG}$) of a region where the conductive layer 104 (floating gate) and the conductive layer 116 (top gate) overlap with the insulating layer 114a provided therebetween and where the semiconductor layer 108 and the conductive layer 116 (top gate) do not overlap. Additionally, $C_{FGOS}$ is proportional to an area (hereinafter referred to as $S_{FGOS}$) of a region where the conductive layer 104 (floating gate) and the semiconductor layer 108 overlap. Thus, when the transistor 100 is designed, by changing $S_{FGCG}$, $S_{FGTG}$, and $S_{FGOS}$, the coupling ratio $C_{FGCG}/(C_{FGTG}+C_{FGOS}+C_{FGCG})$ can be set to a desired value.

For example, when $C_{FGCG}$ increases and $C_{FGTG}$ and $C_{FGOS}$ decrease due to an increase of $S_{FGCG}$ and a decrease of $S_{FGTG}$ and $S_{FGOS}$, the coupling ratio $C_{FGCG}/(C_{FGTG}+C_{FGOS}+C_{FGCG})$ can be increased. According to Formula (1), when the coupling ratio $C_{FGCG}/(C_{FGTG}+C_{FGOS}+C_{FGCG})$ increases, $V_C$ necessary for injecting $Q_{FG}$ into the conductive layer 104 can be reduced.

Furthermore, by decreasing $C_{FGTG}$, an unnecessary increase of parasitic capacitance can be suppressed and frequency characteristics of the transistor 100 can be improved.

$C_{FGCG}$ is inversely proportional to the thickness of the insulating layer 114b (hereinafter referred to as $d_{FGCG}$). $C_{FGTG}$ is inversely proportional to the thickness of the insulating layer 114a (hereinafter referred to as $d_{FGTG}$). Furthermore, $C_{FGOS}$ is inversely proportional to the thickness of the insulating layer 106 in a region where the conductive layer 104 (floating gate) and the semiconductor layer 108 overlap (hereinafter referred to as $d_{FGOS}$). Thus, in the manufacturing process of the transistor 100, $d_{FGCG}$, $d_{FGTG}$, and $d_{FGOS}$ can be adjusted so that a desired coupling ratio $C_{FGCG}/(C_{FGTG}+C_{FGOS}+C_{FGCG})$ is achieved.

For example, by increasing the thickness $d_{FGTG}$ of the insulating layer 114a and the thickness $d_{FGOS}$ of the insulating layer 106 in the region where the conductive layer 104 (floating gate) and the semiconductor layer 108 overlap, $C_{FGTG}$ and $C_{FGOS}$ can also be decreased and the coupling ratio can also be increased. However, when $d_{FGTG}$ increases, it becomes difficult to inject charges from the top gate into the floating gate by a tunnel effect. Accordingly, it is preferable that $d_{FGTG}$ be kept small and $d_{FGOS}$ be made large. In other words, the thickness of the insulating layer 114a is preferably smaller than the thickness of the insulating layer 106 in the region where the conductive layer 104 (floating gate) and the semiconductor layer 108 overlap. Furthermore, the thickness of the insulating layer 114a is preferably greater than or equal to 1 nm and less than or equal to 20 nm, and further preferably greater than or equal to 8 nm and less than or equal to 10 nm, for example.

As an example, $V_{FG}$ will be described in the case where the transistor 100 is designed so that the coupling ratio $C_{FGCG}/(C_{FGTG}+C_{FGOS}+C_{FGCG})$ becomes 0.8. In the transistor 100 in which $d_{FGTG}$ and $d_{FGCG}$ are 8 nm and $d_{FGOS}$ is 20 nm, assuming that $Q_{FG}$ in an initial state is 0 C when the voltage applied to the control gate is 12 V and the voltage applied to the top gate is 0 V, it is found from Formula (1) that $V_{FG}$ becomes 9.6 V. Thus, the potential difference between the top gate and the floating gate becomes 9.6 V and the potential difference between the floating gate and the control gate becomes 2.4 V. At this time, the potential difference between the top gate and the floating gate is sufficiently larger than the potential difference between the floating gate and the control gate, so that an F-N tunneling current flows. Thus, an F-N tunneling current flows between the top gate and the floating gate, and a tunneling current hardly flows between the floating gate and the control gate. With such a method, the charges $Q_{FG}$ can be injected into the floating gate and the amount of charges can be controlled.

Accordingly, with the structure of the transistor 100, since it is possible to hold charges at the floating gate, to control the potential of the floating gate with the held charges, and to change the potential of the semiconductor layer with the potential of the floating gate, the power consumption of the transistor can be decreased and the threshold value can be stably controlled.

[Deposition Method]

An insulating material for forming the insulating layers, a conductive material for forming the electrodes, or a semiconductor material for forming the semiconductor layers can be formed by a sputtering method, a spin coating method, a chemical vapor deposition (CVD) method (including a thermal CVD method, a metal organic chemical vapor deposition (MOCVD) method, a plasma enhanced CVD (PECVD) method, a high density plasma CVD method, a low pressure CVD (LPCVD) method, an atmospheric pressure CVD (APCVD) method, and the like), an atomic layer deposition (ALD) method, a molecular beam epitaxy (MBE) method, or a pulsed laser deposition (PLD) method.

A sputtering method using a parallel-plate-type sputtering apparatus can also be referred to as parallel electrode sputtering (PESP). A sputtering method using a facing-targets sputtering apparatus can also be referred to as vapor deposition sputtering (VDSP).

By using the PECVD method, a high-quality film can be formed at a relatively low temperature. By using a deposition method that does not use plasma for deposition, such as the MOCVD method, the ALD method, or the thermal CVD method, a film can be formed with few defects because damage is not easily caused on a surface on which the film is deposited.

In the case where a film is formed by an ALD method, a gas that does not contain chlorine is preferably used as a material gas.

<Substrate>

There is no particular limitation on a material used as the substrate 101 as long as the material has heat resistance high enough to withstand at least heat treatment performed later. For example, a single crystal semiconductor substrate or a polycrystalline semiconductor substrate made of silicon, silicon carbide, or the like or a compound semiconductor substrate made of silicon germanium or the like may be used as the substrate 101. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. The substrate 101 is not limited to a simple supporting substrate, and may be a substrate where a device such as a transistor is formed. In this case, at least one of the gate, the source, and the drain of the transistor 100 may be electrically connected to the device.

Further alternatively, as the substrate 101, a glass substrate of barium borosilicate glass, aluminoborosilicate glass, or the like, a ceramic substrate, a quartz substrate, or a sapphire substrate can be used. Note that a flexible substrate may also be used as the substrate 101. In the case where a flexible substrate is used, the transistor, a capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

For the flexible substrate, for example, a metal, an alloy, a resin, glass, or fiber thereof can be used. The flexible substrate used as the substrate 101 preferably has a lower coefficient of linear expansion because deformation due to an environment is suppressed. The flexible substrate used as the substrate 101 may be formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

<Insulating Layer>

The insulating layers 102, 106, 112, 114a, 114b, 120, 122 and 124 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

When an oxide semiconductor is used for the semiconductor layer 108, the insulating layers 106, 112, 114a, and 114b are preferably formed using insulating layers from which oxygen is released by heating (hereinafter also referred to as an "insulating layer containing excess oxygen"). Specifically, it is preferable to use an insulating layer of which the amount of released oxygen is greater than or equal to $1.0 \times 10^{15}$ molecules/cm², preferably greater than or equal to $3.0 \times 10^{15}$ molecules/cm² in TDS analysis.

The insulating layer containing excess oxygen can be formed by performing treatment for adding oxygen to an insulating layer. The treatment for adding oxygen can be performed by heat treatment under an oxygen atmosphere, an ion implantation method, an ion doping method, a plasma immersion ion implantation method, plasma treatment, heat treatment under an oxygen atmosphere, or an inverse sputtering treatment. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

For the insulating layer 124, a heat-resistant organic material, such as polyimide, acrylic, benzocyclobutene-based resin, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 124 may be formed by stacking a plurality of insulating layers formed using any of these materials.

Note that the siloxane-based resin corresponds to a resin containing a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the insulating layer 124, and any of the following methods which depend on a material thereof can be used: a sputtering method; an SOG method; spin coating; dipping; spray coating; a droplet discharging method (e.g., an ink-jet method); a printing method (e.g., screen printing, or offset printing); or the like. When the baking step of the insulating layer 124 also serves as heat treatment for another layer, the transistor can be manufactured efficiently.

[Conductive Layer]

The conductive layer 104, the conductive layer 110a, the conductive layer 110b, the conductive layer 116, the conductive layer 118, the conductive layers 126a to 126d, and the conductive layers 130a to 130d can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, and the like. Alternatively, a semiconductor having a high electric conductivity typified by polycrystalline silicon including an impurity element such as phosphorus, or silicide such as nickel silicide may be used.

A conductive material containing the above metal element and oxygen may be used. A conductive material containing the above metal element and nitrogen may be used. For example, a conductive material containing nitrogen such as titanium nitride or tantalum nitride may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used.

A stack of a plurality of conductive layers formed with the above materials may be used. For example, a stacked-layer structure formed using a material containing the above metal element and a conductive material containing oxygen may be used. Alternatively, a stacked-layer structure formed using a material containing the above metal element and a conductive material containing nitrogen may be used. Further alternatively, a stacked-layer structure formed using a material containing the above metal element, a conductive material containing oxygen, and a conductive material containing nitrogen may be used.

The conductive layer 126a, the conductive layer 126b, the conductive layer 126c, and the conductive layer 126d may be formed using, for example, a conductive material with high embeddability, such as tungsten or polysilicon. A conductive material with high embeddability and a barrier layer (a diffusion prevention layer) such as a titanium layer, a titanium nitride layer, or a tantalum nitride layer may be used in combination. Note that the conductive layer 126a, the conductive layer 126b, the conductive layer 126c, and the conductive layer 126d may be regarded as contact plugs.

Here, a conductive material that is less likely to transmit impurities is preferably used for the conductive layer 104, the conductive layer 126a, the conductive layer 126b, the conductive layer 126c, and the conductive layer 126d. As an example of the conductive material that is less likely to transmit to impurities, tantalum nitride can be given.

<Semiconductor Layer>

For the semiconductor layer 108, a single-crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor (also referred to as an OS), a nitride semiconductor, or the like, an organic semiconductor, or the like may be used.

In the case of using an organic semiconductor for the semiconductor layer 108, a low molecular organic material having an aromatic ring, a t-electron conjugated conductive polymer, or the like can be used. For example, rubrene, tetracene, pentacene, perylenediimide, tetracyanoquinodimethane, polythiophene, polyacetylene, polyparaphenylene vinylene, or the like can be used.

The band gap of an oxide semiconductor is greater than or equal to 2 eV; thus, when a transistor including the oxide semiconductor (also referred to as OS transistor) is used for the semiconductor layer 108, a transistor with an extremely low off-state current can be provided. An OS transistor has high withstand voltage between its source and drain. Thus, a transistor with high reliability can be provided. Furthermore, a transistor with high output voltage and high withstand voltage can be provided. Furthermore, a semiconductor device or the like with high reliability can be provided. Furthermore, a semiconductor device with high output voltage and high withstand voltage can be provided.

Alternatively, for example, a transistor including silicon having crystallinity in a semiconductor layer in which a channel is formed (also referred to as crystalline Si transistor) tends to obtain relatively high mobility as compared to the OS transistor. On the other hand, the crystalline Si transistor has difficulty in obtaining extremely small off-state current unlike the OS transistor. Thus, it is important that the semiconductor material used for the semiconductor layer be selected depending on the purpose and the usage.

For example, depending on the purpose and the usage, the OS transistor and the crystalline Si transistor may be used in combination.

<Oxide Semiconductor>

An oxide semiconductor according to the present invention will be described in detail below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an In-M-Zn oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M <Structure>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that the distortion is a portion where the direction of a lattice arrangement changes between a region with a regular lattice arrangement and another region with a regular lattice arrangement in a region in which nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in the a-b plane direction, an interatomic bond distance changed by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced by indium, the layer can also be referred to as an (In,M,Zn) layer. Also, when indium in the In layer is replaced with the element M, the layer can be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

An a-like OS has a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Composition of CAC-OS>

Next, the composition of a cloud-aligned composite (CAC) OS, which is one kind of an oxide semiconductor that can be used for the semiconductor layer 108, will be described.

The CAC-OS refers to, for example, a composition of a material in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0), gallium zinc oxide (Ga$_{X4}$Zn$_{Y4}$O$_{Z4}$, where X4, Y4, and Z4 are real numbers greater than 0), or the like, and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO.

Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the oxide semiconductor exhibits conductivity. Accordingly, when regions including $In_{X2}Zn_{Y2}O_{Z2}$ or $InO_{X1}$ as a main component are distributed in an oxide semiconductor like a cloud, high field-effect mobility (t) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

<Atomic Ratio>

Next, preferred ranges of the atomic ratio of indium, the element M, and zinc contained in an oxide semiconductor according to the present invention will be described with reference to FIGS. 2A to 2C. Note that the proportion of oxygen atoms is not shown in FIGS. 2A to 2C. The terms of the atomic ratio of indium, the element M, and zinc contained in the oxide semiconductor are denoted by [In], [M], and [Zn], respectively.

Figure 2A:
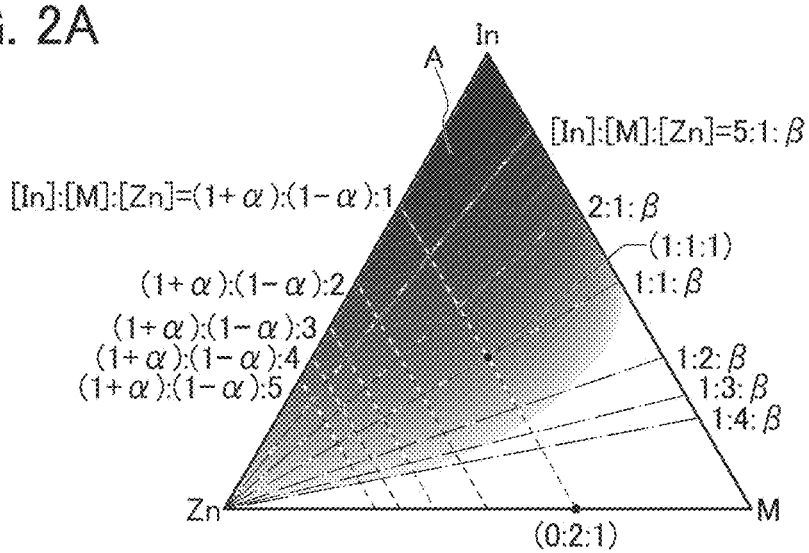
FIGS. 2A to 2C each illustrate an atomic ratio range of an oxide semiconductor of one embodiment of the present invention.
Figure 2B:
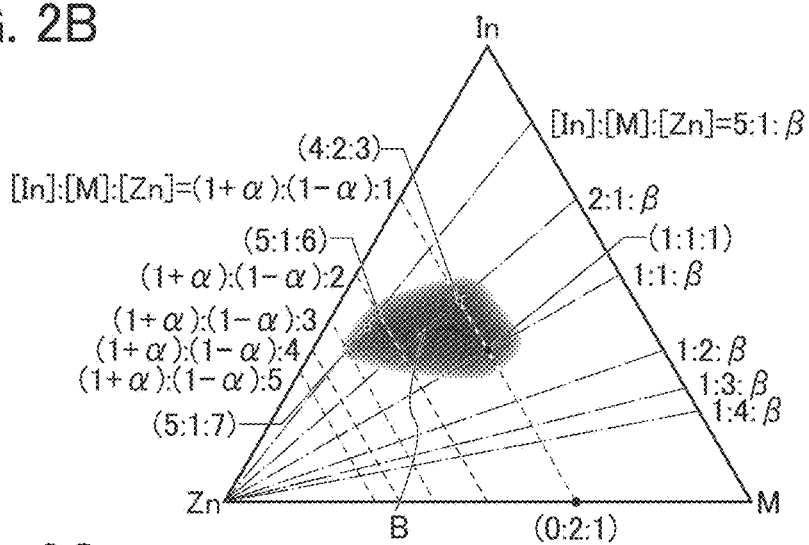
Figure 2C:
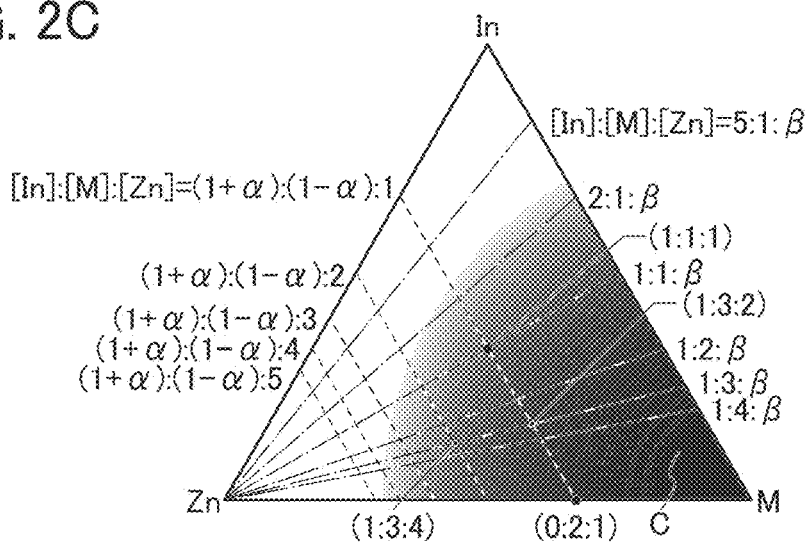

In FIGS. 2A to 2C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$, where $\beta \geq 0$, a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Furthermore, an oxide semiconductor with the atomic ratio of [In]:[M]:[Zn]=0:2:1 or a neighborhood thereof in FIGS. 2A to 2C tends to have a spinel crystal structure.

A plurality of phases (e.g., two phases or three phases) coexist in the oxide semiconductor in some cases. For example, with an atomic ratio [In]:[M]:[Zn] that is close to 0:2:1, two phases of a spinel crystal structure and a layered crystal structure are likely to coexist. In addition, with an atomic ratio [In]:[M]:[Zn] that is close to 1:0:0, two phases of a bixbyite crystal structure and a layered crystal structure are likely to coexist. In the case where a plurality of phases coexist in the oxide semiconductor, a grain boundary might be formed between different crystal structures.

A region A in FIG. 2A represents an example of the preferred range of the atomic ratio of indium, the element M, and zinc contained in an oxide semiconductor.

In addition, the oxide semiconductor containing indium in a higher proportion can have high carrier mobility (electron mobility). Therefore, an oxide semiconductor having a high content of indium has higher carrier mobility than that of an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 2C), insulation performance becomes better.

Accordingly, an oxide semiconductor of one embodiment of the present invention preferably has an atomic ratio represented by a region A in FIG. 2A. With this atomic ratio, a layered structure with high carrier mobility and a few grain boundaries is easily obtained.

An oxide semiconductor with an atomic ratio in the region A, particularly in a region B in FIG. 2B, is excellent because the oxide semiconductor easily becomes a CAAC-OS and has high carrier mobility.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

Note that the region B includes an atomic ratio of [In]:[M]:[Zn]=4:2:3 to 4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

Note that the property of an oxide semiconductor is not uniquely determined by an atomic ratio. Even with the same atomic ratio, the property of an oxide semiconductor might be different depending on a formation condition. For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which an oxide semiconductor tends to have specific characteristics, and boundaries of the regions A to C are not clear.

[Transistor Including Oxide Semiconductor]

Next, the case where the oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8\times10^{11}/cm^3$, preferably lower than $1\times10^{11}/cm^3$, more preferably lower than $1\times10^{10}/cm^3$, and greater than or equal to $1\times10^{-9}/cm^3$ is used.

A highly purified intrinsic or substantially highly purified intrinsic oxide semiconductor film has a low density of defect states and accordingly has a low density of trap states in some cases.

Charge trapped by the trap states in the oxide semiconductor takes a long time to be released and may behave like fixed charge. Thus, the transistor whose channel region is formed in the oxide semiconductor having a high density of trap states has unstable electrical characteristics in some cases.

To obtain stable electrical characteristics of the transistor, it is effective to reduce the concentration of impurities in the oxide semiconductor. In order to reduce the concentration of impurities in the oxide semiconductor, the concentration of impurities in a film which is adjacent to the oxide semiconductor is preferably reduced. As examples of the impurities, hydrogen, nitrogen, alkali metal, alkaline earth metal, iron, nickel, silicon, and the like are given.

<Impurities>

Here, the influence of impurities in the oxide semiconductor is described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/$cm^3$, and preferably lower than or equal to $2\times10^{17}$ atoms/$cm^3$.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally-on. Therefore, it is preferable to reduce the concentration of alkali metal or alkaline earth metal of the oxide semiconductor. Specifically, the concentration of alkali metal or alkaline earth metal in the oxide semiconductor measured by SIMS is set lower than or equal to $1\times10^{18}$ atoms/$cm^3$, and preferably lower than or equal to $2\times10^{16}$ atoms/$cm^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the nitrogen concentration measured by SIMS is set, for example, lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, and still further preferably lower than or equal to $5\times10^{17}$ atoms/$cm^3$.

Hydrogen contained in an oxide semiconductor reacts with oxygen bonded to a metal atom to water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally-on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurity concentration is used for a channel region in a transistor, the transistor can have stable electrical characteristics.

<Band Diagram>

Figure 3A:
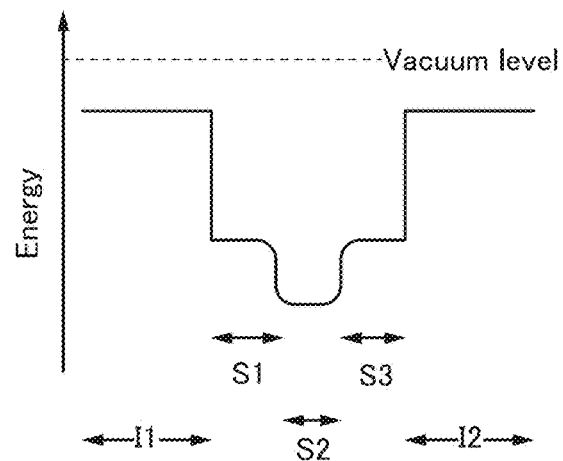
FIGS. 3A to 3C are each a band diagram of a stacked-layer structure of oxide semiconductors of one embodiment of the present invention.
Figure 3B:
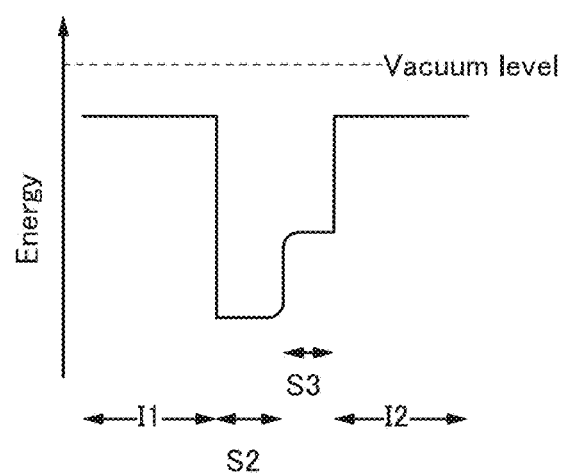
Figure 3C:
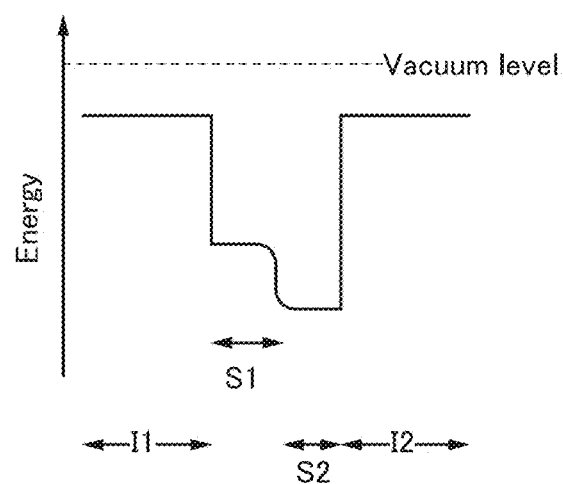

Next, the case where the oxide semiconductor has a two-layer structure or a three-layer structure is described. With reference to FIGS. 3A to 3C, the description is made on a band diagram of a layered structure of an oxide semiconductor S1, an oxide semiconductor S2, and an oxide semiconductor S3 and insulating layers that are in contact with the layered structure; a band diagram of a layered structure of the oxide semiconductor S2 and the oxide semiconductor S3 and insulating layers that are in contact with the layered structure; and a band diagram of a layered structure of the oxide semiconductor S1 and the oxide semiconductor S2 and insulating layers that are in contact with the layered structure.

FIG. 3A is an example of a band diagram of a stacked structure including an insulating layer I1, the oxide semiconductor S1, the oxide semiconductor S2, the oxide semiconductor S3, and an insulating layer I2 in a film thickness direction. FIG. 3B is an example of a band diagram of a stacked structure including the insulating layer I1, the oxide semiconductor S2, the oxide semiconductor S3, and the insulating layer I2 in a film thickness direction. FIG. 3C is an example of a band diagram of a stacked-layer structure including the insulating layer I1, the oxide semiconductor S1, the oxide semiconductor S2, and the insulating layer I2 in a thickness direction. Note that for easy understanding, the band diagrams show the energy level of the conduction band minimum (Ec) of each of the insulating layer I1, the oxide semiconductor S1, the oxide semiconductor S2, the oxide semiconductor S3, and the insulating layer I2.

The energy level of the conduction band minimum of each of the oxide semiconductors S1 and S3 is closer to the vacuum level than that of the oxide semiconductor S2. Typically, a difference in energy level between the conduction band minimum of the oxide semiconductor S2 and the conduction band minimum of each of the oxide semiconductors S1 and S3 is preferably greater than or equal to 0.15 eV or greater than or equal to 0.5 eV, and less than or equal to 2 eV or less than or equal to 1 eV. That is, it is preferable that the difference between the electron affinity of each of the oxide semiconductors S1 and S3 and the electron affinity of the oxide semiconductor S2 be greater than or equal to 0.15 eV or greater than or equal to 0.5 eV, and less than or equal to 2 eV or less than or equal to 1 eV.

As shown in FIGS. 3A to 3C, the conduction band minimum of each of the oxide semiconductors S1 to S3 is gradually varied. In other words, the energy level of the conduction band minimum is continuously varied or continuously connected. In order to obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and high on-state current can be obtained.

When an electron is trapped in a trap state, the trapped electron behaves like a fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 2C can be used as the oxide semiconductors S1 and S3. Note that the region C in FIG. 2C represents the atomic ratio [In]:[M]:[Zn] of 0:1:0, 1:3:2, and 1:3:4 and the vicinities thereof.

In the case where an oxide semiconductor with the atomic ratio represented by the region A is used as the oxide semiconductor S2, it is particularly preferable to use an oxide semiconductor with [M]/[In] of greater than or equal to 1, preferably greater than or equal to 2, as each of the oxide semiconductors S1 and S3. In addition, it is suitable to use an oxide semiconductor with sufficiently high insulation performance and [M]/([Zn]+[In]) of greater than or equal to 1 as the oxide semiconductor S3.

<Method for Manufacturing Transistor>

Next, an example of a method for manufacturing a semiconductor device including the transistor 100 shown in FIGS. 1A to 1C will be described with reference to FIGS. 4A to 4E, FIGS. 5A to 5C, and FIGS. 6A to 6C.

An A-B cross section in each of FIGS. 4A to 4E, FIGS. 5A to 5C, and FIGS. 6A to 6C corresponds to the cross section taken along dashed dotted line A-B in FIG. 1A. A C-D cross section in each of FIGS. 4A to 4E, FIGS. 5A to 5C, and FIGS. 6A to 6C corresponds to the cross section taken along dashed dotted line CD in FIG. 1A.

[Step 1]

Figure 4A:
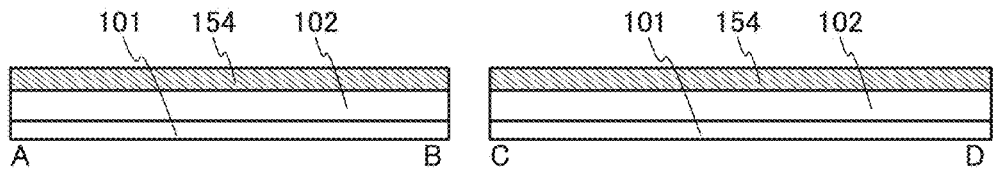
FIGS. 4A to 4E are cross-sectional views illustrating a method for manufacturing a transistor according to one embodiment of the present invention.

First, the insulating layer 102 and a conductive layer 154 are sequentially formed over the substrate 101 (see FIG. 4A). In this embodiment, a single crystal silicon substrate (a p-type semiconductor substrate or an n-type semiconductor substrate) is used as the substrate 101, and a silicon oxynitride film is formed by a CVD method as the insulating layer 102.

[Step 2]

Next, a resist mask is formed over the sample surface (not illustrated). The resist mask can be formed by a photolithography method, a printing method, an inkjet method, or the like as appropriate. The resist mask may be formed by a printing method, an inkjet method, or the like, in which case manufacturing costs can be reduced because a photomask is not used.

The formation of the resist mask by a photolithography method can be performed in such a manner that a photosensitive resist is irradiated with light through a photomask and part of the resist which has been exposed to light (or has not been exposed to light) is removed using a developing solution. Examples of light with which the photosensitive resist is irradiated include KrF excimer laser light, ArF excimer laser light, extreme ultraviolet (EUV) light, and the like. Alternatively, a liquid immersion technique may be employed in which light exposure is performed with a portion between a substrate and a projection lens filled with liquid (e.g., water). An electron beam or an ion beam may be used instead of the above-mentioned light. Note that a photomask is not necessary in the case of using an electron beam or an ion beam. Note that a dry etching method such as ashing or a wet etching method using a dedicated stripper or the like can be used for removal of the resist mask. Both the dry etching method and the wet etching method may be used.

Figure 4B:
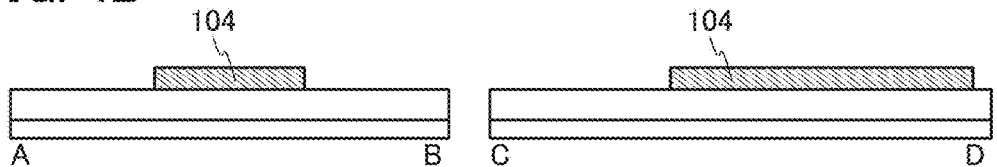

With the use of the resist mask as a mask, part of the conductive layer 154 is selectively removed to form the conductive layer 104 (see FIG. 4B). After that, the resist mask is removed. When the conductive layer 104 is formed, part of the insulating layer 102 is also removed in some cases.

[Step 3]

Next, the insulating layer 106 is formed over the sample surface. In this embodiment, a silicon oxynitride film is formed by a CVD method as the insulating layer 106. Next, the sample surface is subjected to chemical mechanical polishing (CMP) treatment (also referred to as CMP treatment). By CMP treatment, unevenness of the sample surface can be reduced, and coverage with an insulating layer or a conductive layer to be formed later can be increased.

[Step 4]

Figure 4C:
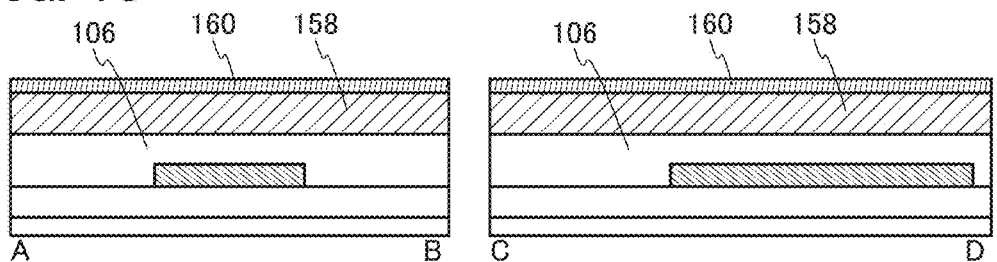
Figure 4D:
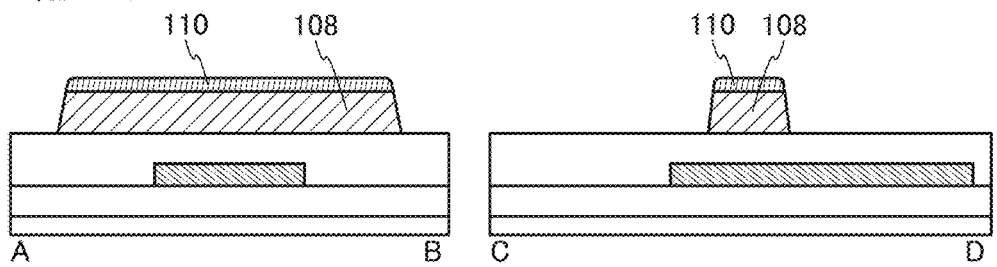

Next, the semiconductor layer 158 and the conductive layer 160 are sequentially formed over the sample surface (see FIG. 4C). In this embodiment, the semiconductor layer 158 is formed by a sputtering method using a target having a composition of In:Ga:Zn: =1:1:1. At this time, the deposition temperature is preferably higher than or equal to room temperature and lower than or equal to 200° C., and the proportion of oxygen in the deposition gas was higher than or equal to 0% and lower than or equal to 30%. As the conductive layer 185, a tungsten film is formed by a sputtering method.

[Step 5]

Next, a resist mask is formed over the sample surface by a photolithography method (not illustrated). With the use of the resist mask as a mask, part of the conductive layer 160 is selectively removed to form the conductive layer 110. After the resist is removed, the semiconductor layer 158 is etched with the use of the conductive layer 110 as a mask, whereby the semiconductor layer 108 is formed (see FIG. 4D).

[Step 6]

Figure 4E:
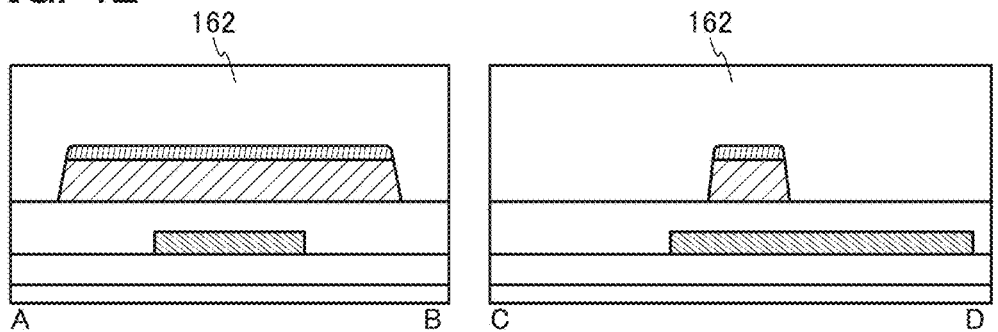

Next, the insulating layer 162 is formed over the sample surface (see FIG. 4E). In this embodiment, a silicon oxynitride film is formed by a CVD method as the insulating layer 162. Next, the sample surface is subjected to CMP treatment.

Figure 5A:
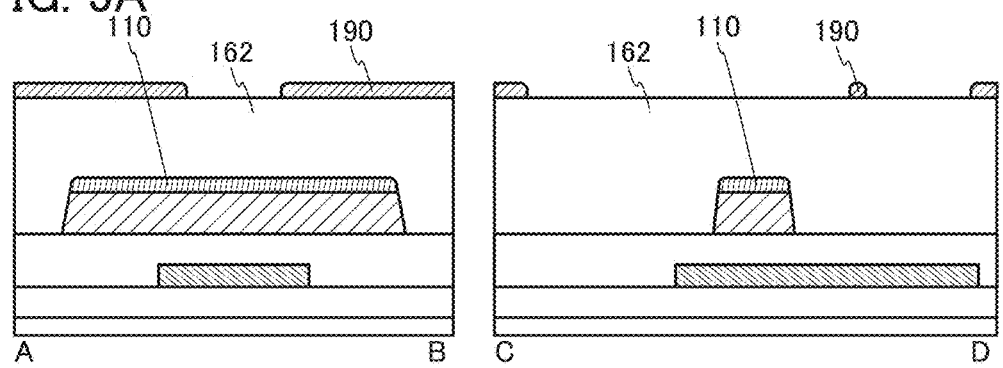
FIGS. 5A to 5C are cross-sectional views illustrating a method for manufacturing a transistor according to one embodiment of the present invention.
Figure 5B:
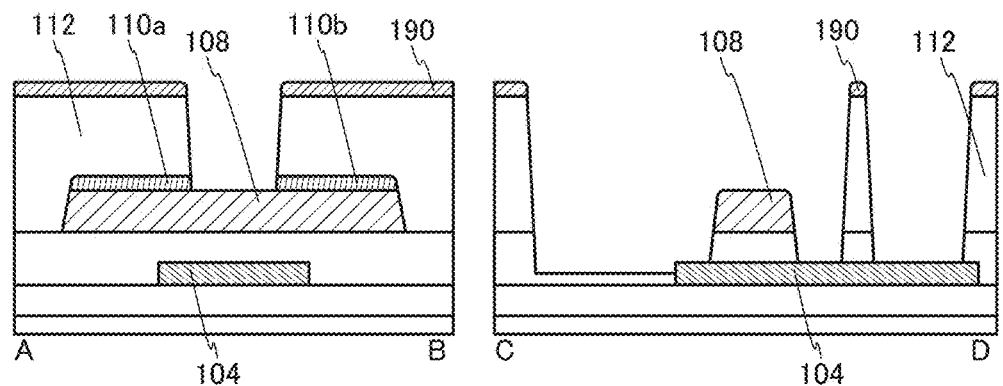
Figure 5C:
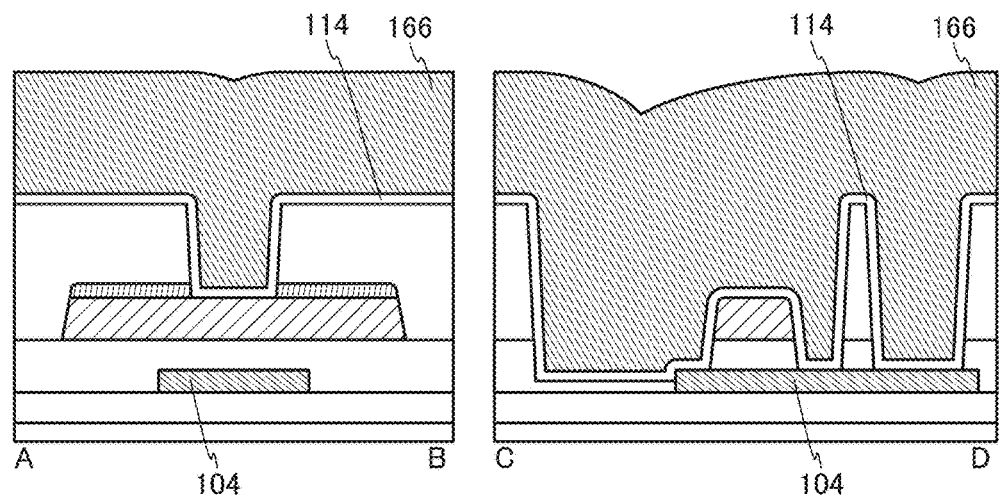

Next, a resist mask 190 is formed over the sample surface by a photolithography method (see FIG. 5A). With the use of the resist mask 190 as a mask, part of the insulating layer 162 is selectively removed to expose part of a surface of the semiconductor layer 108 and part of a surface of the conductive layer 104, so that the insulating layer 112 is formed (see FIG. 5B). Furthermore, part of the conductive layer 110 is selectively removed to form the conductive layer 110a and the conductive layer 110b. At this time, part of the surface of the semiconductor layer 108 is also removed in some cases.

[Step 7]

Next, after the resist mask 190 is removed, the insulating layer 114 and a conductive layer 166 are sequentially formed over the sample surface. In this embodiment, a silicon oxynitride film is formed by a CVD method as the insulating layer 114, and a tungsten film is formed as the conductive layer 166 (see FIG. 5C). A thickness of the insulating layer 114 is preferably greater than or equal to 1 nm and less than or equal to 20 nm, further preferably greater than or equal to 8 nm and less than or equal to 10 nm. Since the insulating layer 114 is formed after part of the surface of the conductive layer 104 has been exposing, a thin insulating layer 114 can be directly formed over the surface of the conductive layer 104. Accordingly, in the transistor 100 to be fabricated, injection of charges into the floating gate becomes possible.

[Step 8]

Next, the sample surface is subjected to CMP treatment. Part of the conductive layer 166 is removed by CMP treatment, whereby the conductive layer 116 and the conductive layer 118 can be formed at the same time (see FIG. 6A). At this time, part of the insulating layer 112 and part of the insulating layer 114 are also removed, so that the insulating layer 114a and the insulating layer 114b can be formed at the same time. However, part of the insulating layer 114 does not have to be removed, and the insulating layer 114a and the insulating layer 114b may be connected to each other.

[Step 9]

Next, the insulating layer 120 and the insulating layer 122 are sequentially formed over the sample surface. In this embodiment, a silicon oxynitride film is formed by a CVD method as the insulating layer 120, and an aluminum oxide film is formed by a sputtering method as the insulating layer 122. During the formation of the insulating layer 122, part of oxygen used as the sputtering gas is introduced into the insulating layer 120, the insulating layer 112, and the insulating layer 114a.

[Step 10]

After the formation of the insulating layer 122, heat treatment is performed. By performing heat treatment after the insulating layer 122 has been formed, it is possible to introduce oxygen contained in the insulating layer 120, the insulating layer 112, and the insulating layer 114a into the oxide semiconductor layer.

[Step 11]

Figure 6A:
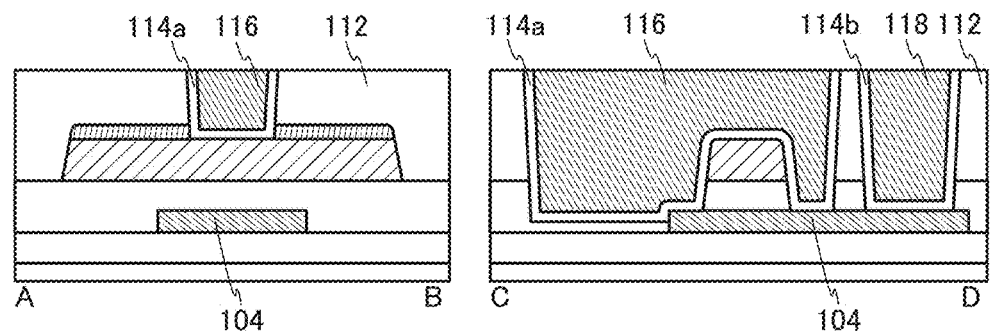
FIGS. 6A to 6C are cross-sectional views illustrating a method for manufacturing a transistor according to one embodiment of the present invention.
Figure 6B:
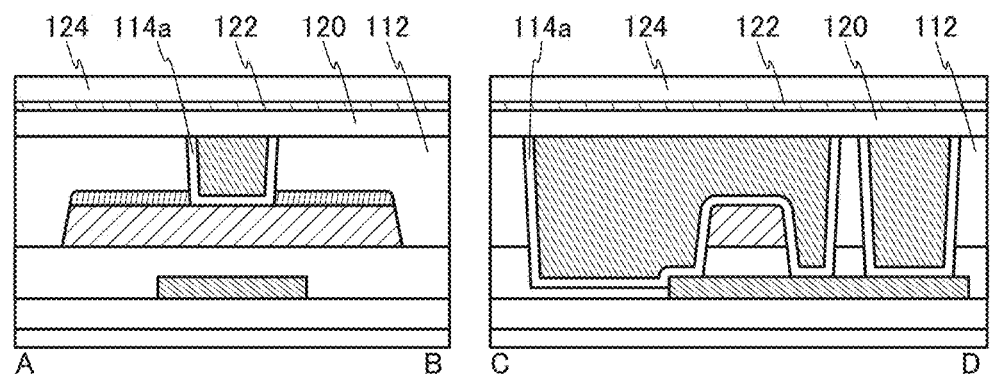

Next, the insulating layer 124 is formed over the sample surface (see FIG. 6B). In this embodiment, a low-k material such as silicon oxide to which fluorine is added, silicon oxide to which carbon is added, or the like is formed as the insulating layer 124.

[Step 12]

Next, a resist mask is formed over the sample surface by a photolithography method (not illustrated). With the use of the resist mask as a mask, part of each of the insulating layer 112, the insulating layer 120, the insulating layer 122, and the insulating layer 124 is removed to form an opening.

[Step 13]

Figure 6C:
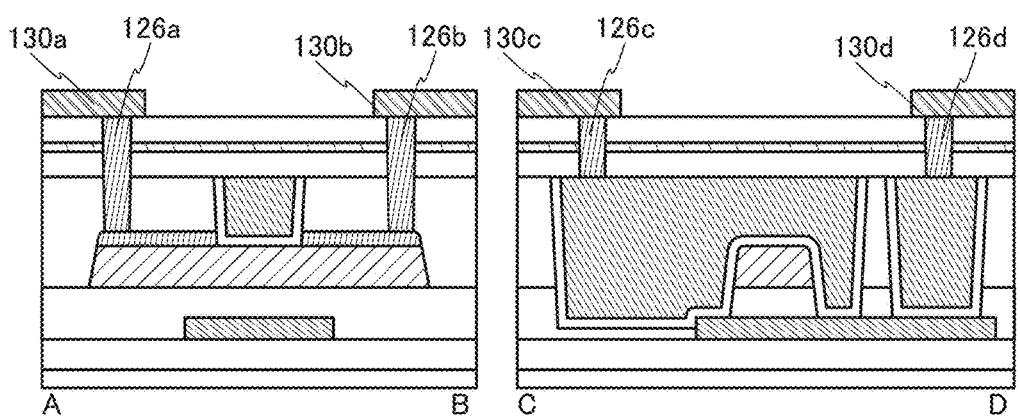

Next, after a conductive layer is formed over the sample surface, the conductive layer 126a, the conductive layer 126b, the conductive layer 126c, and the conductive layer 126d are formed by CMP treatment (see FIG. 6C). In this embodiment, a tungsten film is formed by a CVD method as the conductive layer 126a, the conductive layer 126b, the conductive layer 126c, and the conductive layer 126d. Note that when CMP treatment is performed, part of a surface of the insulating layer 124 is also removed in some cases.
[Step 14]

Next, after a conductive layer is formed over the sample surface, a resist mask is formed by a photolithography method. By selectively removing part of the conductive layer with the use of the resist mask as a mask, the conductive layer 130a, the conductive layer 130b, the conductive layer 130c, and the conductive layer 130d are formed (see FIG. 6C). In this embodiment, a tungsten film is formed by a sputtering method as the conductive layer 130a, the conductive layer 130b, the conductive layer 130c, and the conductive layer 130d. Note that when the conductive layer 130a, the conductive layer 130b, the conductive layer 130c, and the conductive layer 130d are formed, part of the insulating layer 124 is also removed in some cases.
<Modification of Transistor>

Next, a transistor 100b, a transistor 100c, a transistor 100d, a transistor 100e, and a transistor 100f, which are modifications of the transistor 100, will be described with reference to FIGS. 7A to 7C, FIGS. 8A to 8C, FIGS. 9A to 9C, FIGS. 10A to 10C, FIGS. 11A to 11C, FIGS. 12A to 12C, FIGS. 13A to 13C, FIGS. 14A to 14E, FIGS. 15A to 15C, and FIGS. 16A to 16C. Note that for components which are not mentioned in the description of the modification example, the description of the transistor 100 can be referred to.

Note that in the transistor 100b, the transistor 100c, the transistor 100d, the transistor 100e, and the transistor 100f, a direction from a point C to a point D indicated by the dashed-dotted line C-D is referred to as the channel width direction and a direction from a point A to a point B indicated by the dashed-dotted line A-B is referred to as the channel length direction. Furthermore, in the transistor 100b, the transistor 100c, the transistor 100d, the transistor 100e, and the transistor 100f, it can also be said that a direction from the conductive layer 130c to the conductive layer 130d is the channel width direction and a direction from the conductive layer 130a to the conductive layer 130b is the channel length direction.

Figure 7A:
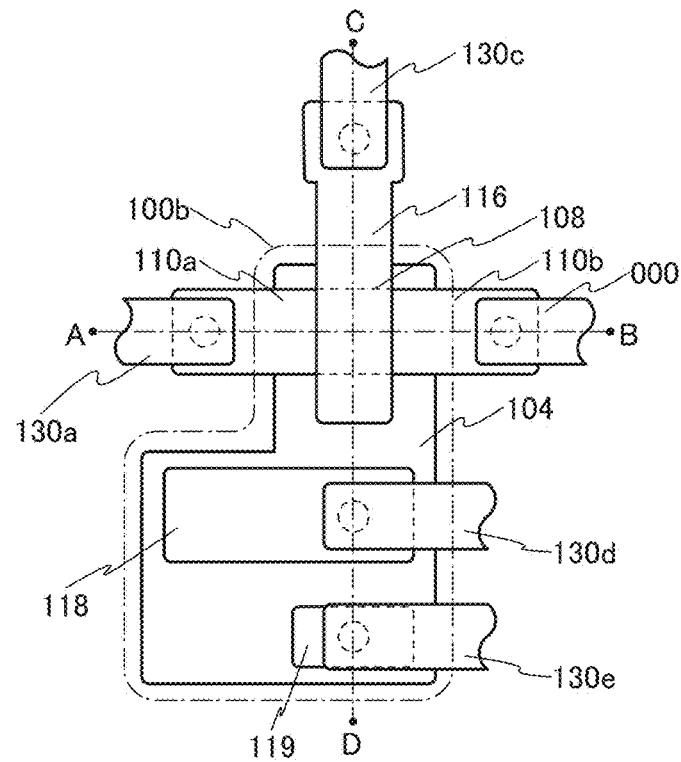
FIGS. 7A to 7C are a top view and cross-sectional views illustrating a transistor of one embodiment of the present invention.
Figure 7B:
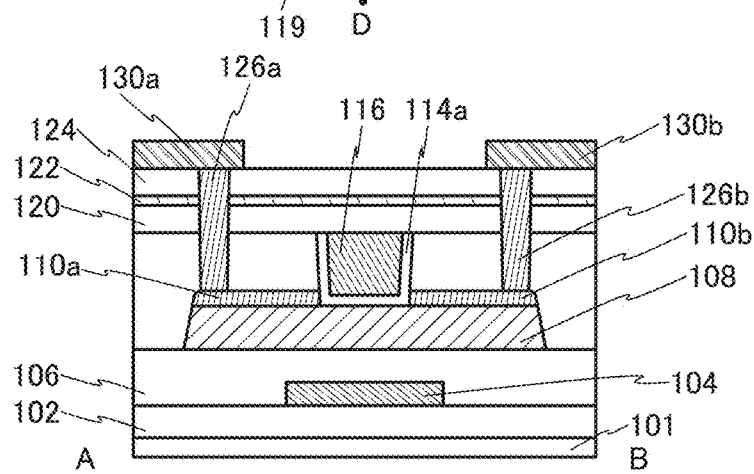
Figure 7C:
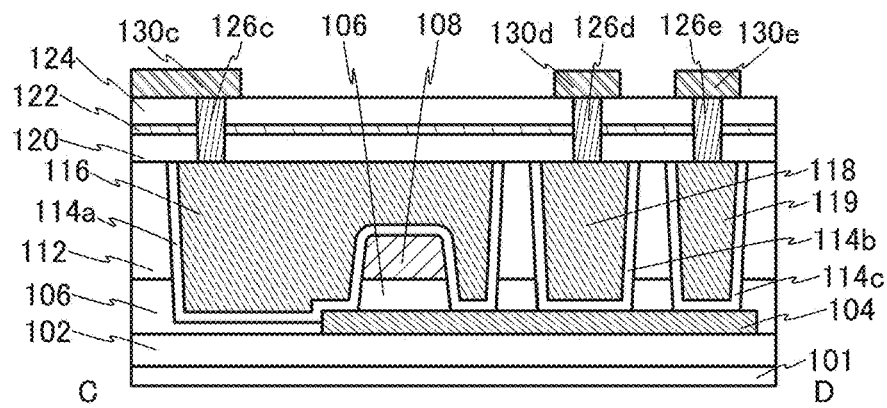

First, the transistor 100b will be described with reference to FIGS. 7A to 7C. The transistor 100b has the same structure as the transistor 100 with the addition of a second control gate. FIG. 7A is a top view of the semiconductor device including the transistor 100b. FIG. 7B shows a cross section of the semiconductor device taken along the dashed-dotted line A-B in FIG. 7A. FIG. 7C shows a cross section of the semiconductor device taken along the dashed-dotted line C-D in FIG. 7A.

The transistor 100b has the same structure as the transistor 100 with the addition of an insulating layer 114c and a conductive layer 119. The conductive layer 119 is, like the conductive layer 118, provided to overlap with the conductive layer 104 with the insulating layer 114c provided therebetween. Furthermore, a conductive layer 130e and a conductive layer 126e are provided over the transistor 100b in addition to the conductive layers 126a to 126d and the conductive layers 130a to 130d. The conductive layer 130e is electrically connected to the conductive layer 119 through the conductive layer 126e.

In the transistor 100b, both the conductive layer 118 and the conductive layer 119 have a function of injecting charges into the conductive layer 104. For the sake of simplicity, hereinafter, the conductive layer 104 will be referred to as a floating gate, the conductive layer 118 will be referred to as a first control gate, and the conductive layer 119 will be referred to as a second control gate.

In the transistor 100b, when charges are injected into the floating gate, the first control gate and the second control gate of the transistor 100b have the same functions as the top gate and the control gate of the transistor 100. In other words, it is possible to inject charges into the conductive layer 104 functioning as the floating gate when both the first control gate and the second control gate are used.

Specifically, when the potential difference between the first control gate and the second control gate is made large for a certain amount of time, the potential difference between the first control gate and the floating gate and the potential difference between the second control gate and the floating gate increases. At this time, when the potential difference between the second control gate and the floating gate needs to be larger than the potential difference between the first control gate and the floating gate, the transistor 100b may be designed so that an area of a region where the conductive layer 119 (second control gate) and the conductive layer 104 (floating gate) overlap is smaller than an area of a region where the conductive layer 118 (first control gate) and the conductive layer 104 (floating gate) overlap, as shown in FIG. 7A. With such a design, by making the potential difference between the first control gate and the second control gate sufficiently large, charges are injected from the second control gate into the floating gate through the insulating layer due to an F-N tunneling current.

The thickness of each of the insulating layer 114b and the insulating layer 114c is preferably smaller than a thickness of the insulating layer 106 in the region where the conductive layer 104 and the semiconductor layer 108 overlap, because an F—N tunneling current flows easily between the floating gate and the first control gate or the second control gate.

For more details about the design method, the description of the transistor 100 can be referred to. Note that in the case of using Formula (1) when designing the transistor 100b, $C_{FGTG}$ in Formula (1) may be rephrased as the capacitance between the floating gate and the second control gate, $C_{FGCG}$ in Formula (1) may be rephrased as the capacitance between the floating gate and the first control gate, and $C_{FGOS}$ in Formula (1) may be replaced with 0.

After injecting charges into the floating gate, even when the potential difference between the first control gate and the second control gate is made small, the injected charges can be held because the floating gate is in an electrically floating state. Additionally, the potential of the semiconductor layer can be changed by the held charges; thus, the threshold value of the transistor 100b can be changed.

The formation of the conductive layer 119 in the manufacturing process of the transistor 100b may be performed in a manner similar to that of the formation of the conductive layer 118 in the manufacturing process of the transistor 100. Thus, the conductive layer 119 can be formed at the same time as the conductive layer 116 and the conductive layer 118.

For the conductive layer 119, the same material which is used for the conductive layer 118 can be used. For the insulating layer 114c, the same material which is used for the insulating layer 114a and the insulating layer 114b can be used. For the conductive layer 126e, the same material which is used for the conductive layers 126a to 126d can be used. For the conductive layer 130e, the same material which is used for the conductive layers 130a to 130d can be used.

Figure 8A:
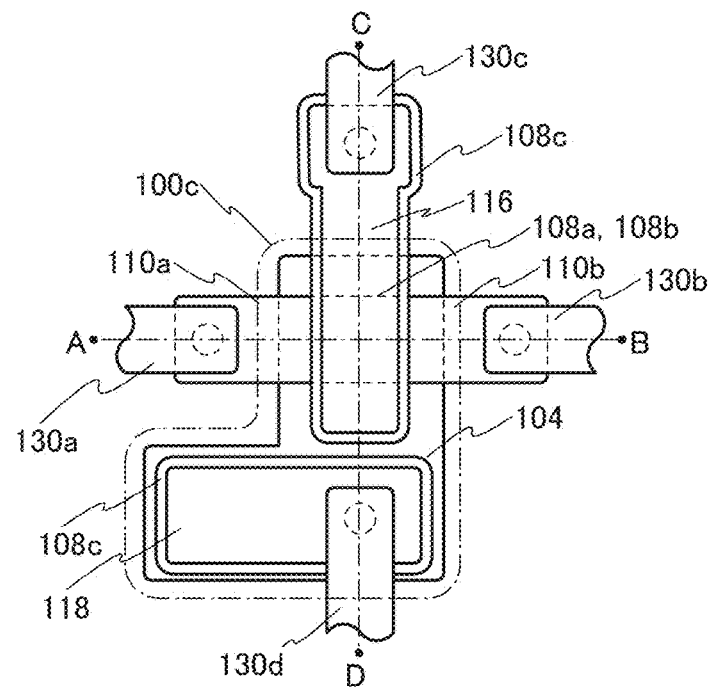
FIGS. 8A to 8C are a top view and cross-sectional views illustrating a transistor of one embodiment of the present invention.
Figure 8B:
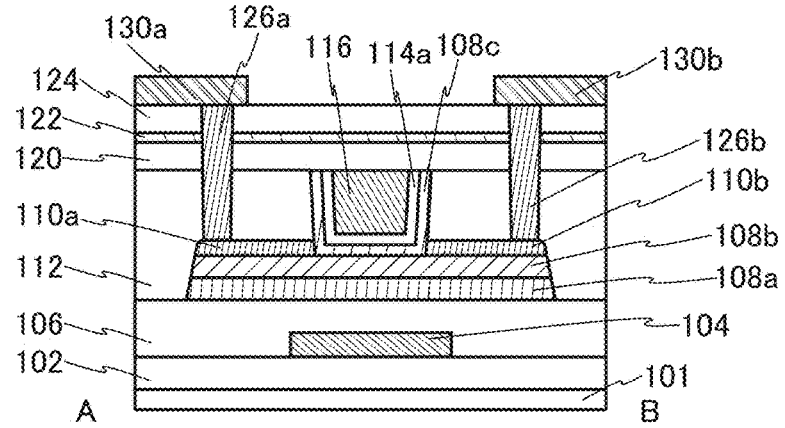
Figure 8C:
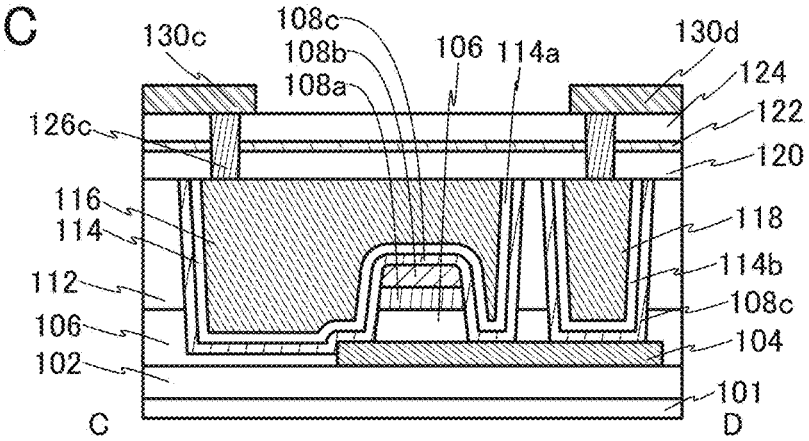

Next, the transistor 100c will be described with reference to FIGS. 8A to 8C. The transistor 100c is a specific example in which a semiconductor layer is formed with a three-layered structure of an oxide semiconductor layer 108a, an oxide semiconductor layer 108b, and an oxide semiconductor layer 108c. FIG. 8A is a top view of the semiconductor device including the transistor 100c. FIG. 8B shows a cross section of the semiconductor device taken along the dashed-dotted line A-B in FIG. 8A. FIG. 8C shows a cross section of the semiconductor device taken along the dashed-dotted line C-D in FIG. 8A.

The transistor 100c includes the oxide semiconductor layer 108a over a projection of the insulating layer 106 and the oxide semiconductor layer 108b over the oxide semiconductor layer 108a. The conductive layer 110a and the conductive layer 110b are provided in contact with part of a top surface of the oxide semiconductor layer 108b. Furthermore, the oxide semiconductor layer 108c is provided in contact with another part of the top surface of the oxide semiconductor layer 108b and part of side surfaces of the oxide semiconductor layers 108a and 108b.

The insulating layer 114a is in contact with the oxide semiconductor layer 108c. Furthermore, the transistor 100c includes a first region having the insulating layer 114a and the oxide semiconductor layer 108c between the conductive layer 104 and the conductive layer 116 and a second region having the insulating layer 106, the oxide semiconductor layers 108a to 108c, and the insulating layer 114a between the conductive layer 104 and the conductive layer 116.

Since the insulating layer 114a and the oxide semiconductor layer 108c are thin, charges can be injected from the conductive layer 116 into the conductive layer 104 in the first region. A thickness of the oxide semiconductor layer 108c is, for example, preferably greater than or equal to 1 nm and less than or equal to 20 nm, further preferably greater than or equal to 8 nm and less than or equal to 10 nm.

Note that trap levels due to impurities or defects might be formed in the vicinity of the interface between an insulating layer and each of the oxide semiconductor layers 108a to 108c. In the transistor 100c, owing to the oxide semiconductor layers 108a and 108c, the oxide semiconductor layer 108b functioning as a channel can be spaced apart from the trap levels. Thus, since the influence of the trap levels can be suppressed due to the structure of the transistor 100c, the reliability of the transistor can be improved.

Figure 9A:
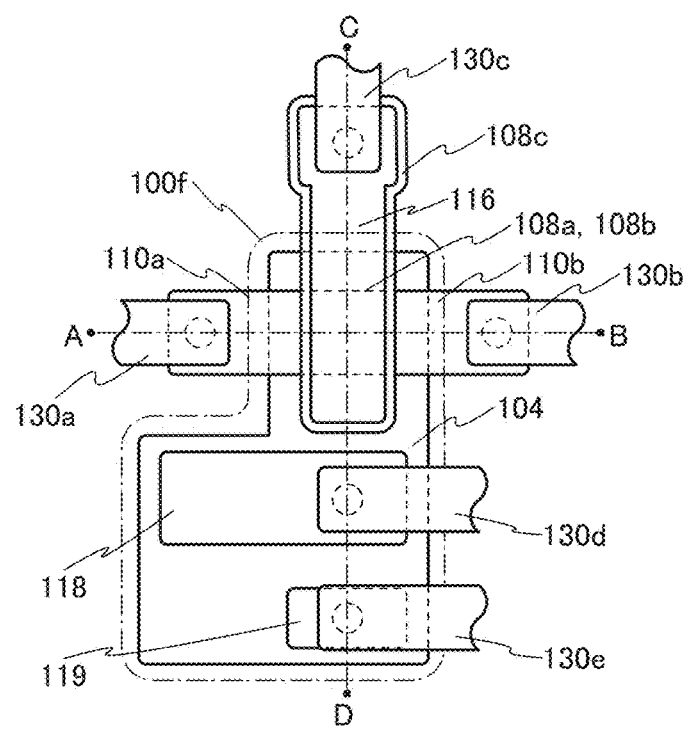
FIGS. 9A to 9C are a top view and cross-sectional views illustrating a transistor of one embodiment of the present invention.
Figure 9B:
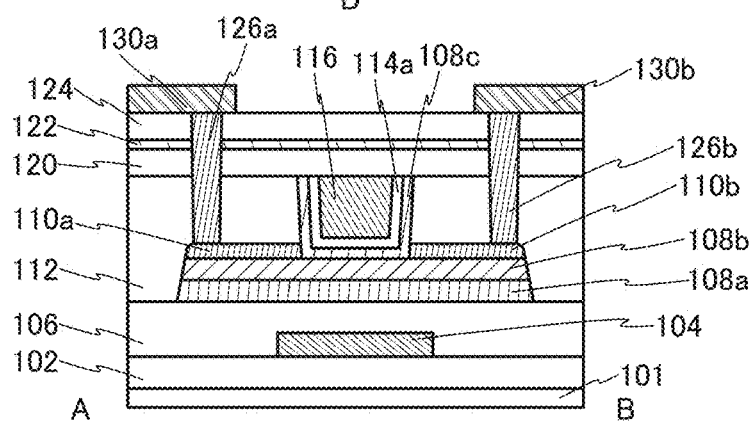
Figure 9C:
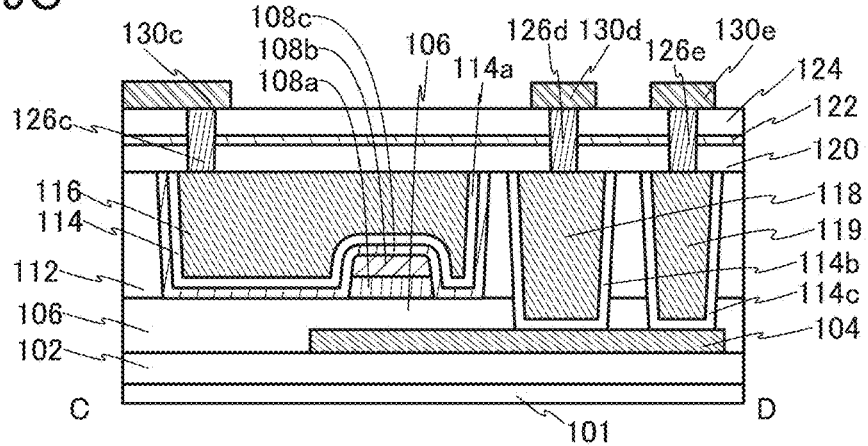

Next, the transistor 100f will be described with reference to FIGS. 9A to 9C. The transistor 100f has a structure similar to a structure in which the transistor 100b shown in FIGS. 7A to 7C and the transistor 100c shown in FIGS. 8A to 8C are combined. FIG. 9A is a top view of the semiconductor device including the transistor 100f. FIG. 9B shows a cross section of the semiconductor device taken along the dashed-dotted line A-B in FIG. 9A. FIG. 9C shows a cross section of the semiconductor device taken along the dashed-dotted line C-D in FIG. 9A.

The transistor 100f has the same structure as the transistor 100 with the addition of the insulating layer 114c and the conductive layer 119. The conductive layer 119 is, like the conductive layer 118, provided to overlap with the conductive layer 104 with the insulating layer 114c provided therebetween. Furthermore, the conductive layer 130e and the conductive layer 126e are provided over the transistor 100f in addition to the conductive layers 126a to 126d and the conductive layers 130a to 130d. The conductive layer 130e is electrically connected to the conductive layer 119 through the conductive layer 126e.

The transistor 100f includes the oxide semiconductor layer 108a over a protrusion of the insulating layer 106 and the oxide semiconductor layer 108b over the oxide semiconductor layer 108a. The conductive layer 110a and the conductive layer 110b are provided in contact with part of the top surface of the oxide semiconductor layer 108b. Furthermore, the oxide semiconductor layer 108c is provided in contact with another part of the top surface of the oxide semiconductor layer 108b and part of side surfaces of the oxide semiconductor layers 108a and 108b.

Furthermore, the transistor 100f is different from the transistor 100b in that the transistor 100f can be formed in such a way that the conductive layer 116 is formed after the formation of the conductive layer 118 and the conductive layer 119.

Note that for components which are not mentioned in the description of the transistor 100f, the descriptions of the transistor 100b and the transistor 100c can be referred to.

Next, a method for manufacturing the transistor 100f is described with reference to FIGS. 10A to 10C, FIGS. 11A to 11C, and FIGS. 12A to 12C. A cross section C-D in each of FIGS. 10A to 10C, FIGS. 11A to 11C, and FIGS. 12A to 12C corresponds to the cross section taken along the dashed-dotted line C-D in FIG. 9A.

Figure 10A:
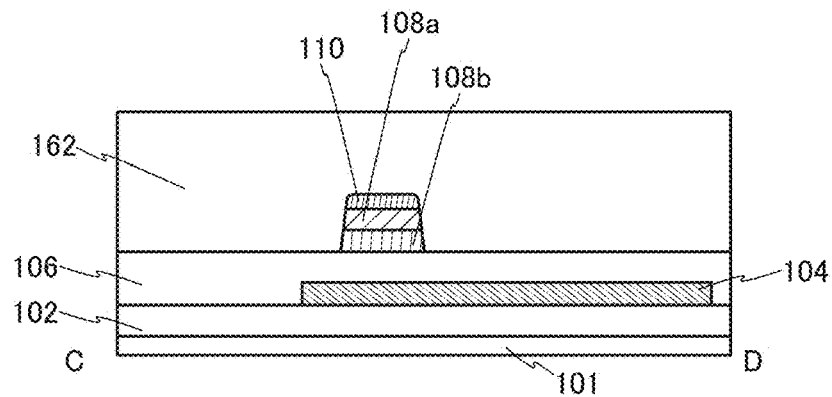
FIGS. 10A to 10C are cross-sectional views illustrating a method for manufacturing a transistor of one embodiment of the present invention.

First, through a manufacturing method which is similar to steps 1 to 6 of the manufacturing method of the transistor 100 (see FIGS. 4A to 4E), the conductive layer 104, the insulating layer 106, the oxide semiconductor layer 108a, the oxide semiconductor layer 108b, and the insulating layer 162 are formed over the substrate 101 and the insulating layer 102 (see FIG. 10A).

Figure 10B:
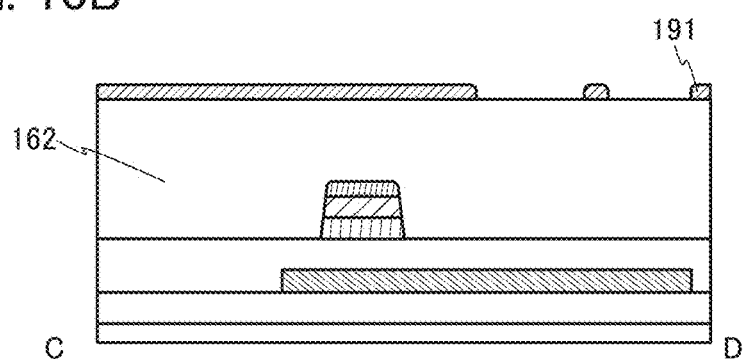
Figure 10C:
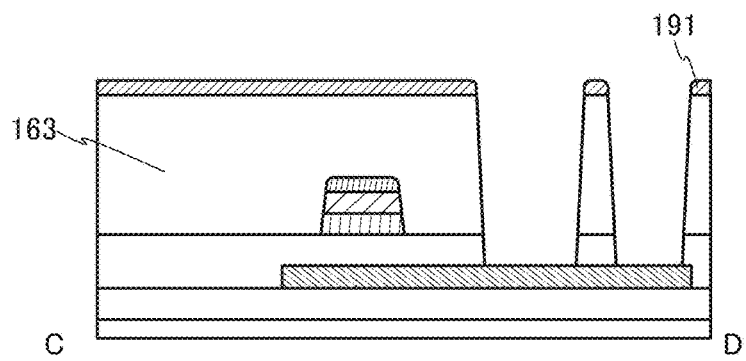

Next, a mask 191 is formed over the sample surface (see FIG. 10B). With the use of the mask 191, part of the insulating layer 162 is selectively removed to expose part of the surface of the conductive layer 104, so that the insulating layer 163 is formed (see FIG. 10C). This manufacturing method differs from the manufacturing method of the transistor 100 in that the insulating layer 162 positioned in a region where the oxide semiconductor layer 108a and the oxide semiconductor layer 108b overlap is not removed at this time.

As the mask 191, a resist mask formed by a photolithography method, a hard mask formed by patterning of a stacked layer of a metal layer and an insulating film, or a stacked-layer structure of both of these or the like can be used.

Figure 11A:
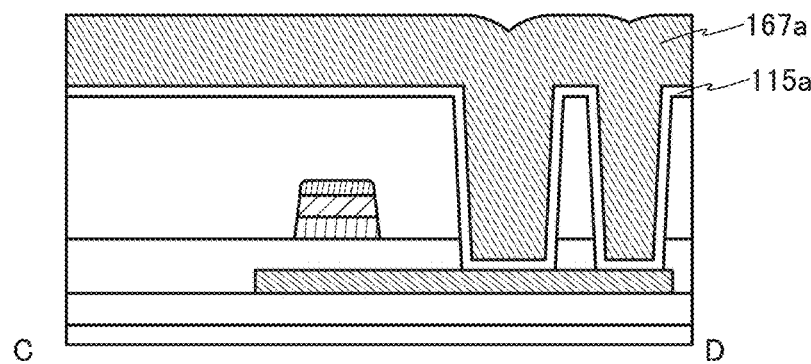
FIGS. 11A to 11C are cross-sectional views illustrating a method for manufacturing a transistor of one embodiment of the present invention.

Next, after the mask 191 is removed, an insulating layer 115a and a conductive layer 167a are sequentially formed over the sample surface (see FIG. 11A). The insulating layer 115a may be formed by a method similar to that of the insulating layer 114. Furthermore, the conductive layer 167a may be formed by a method similar to that of the conductive layer 166.

Next, the sample surface is subjected to CMP treatment. By removing part of the conductive layer 167a with CMP treatment, the conductive layer 118 and the conductive layer 119 can be formed at the same time (see FIG. 11B). At this time, part of the insulating layer 163 and the insulating layer 115a are also removed so that the insulating layer 114b and the insulating layer 114c can be formed at the same time. However, part of the insulating layer 115a does not have to be removed, and the insulating layer 114b and the insulating layer 114c may be connected to each other.

Figure 11B:
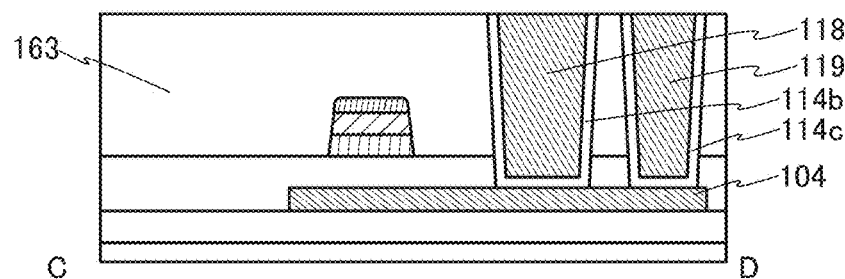
Figure 11C:
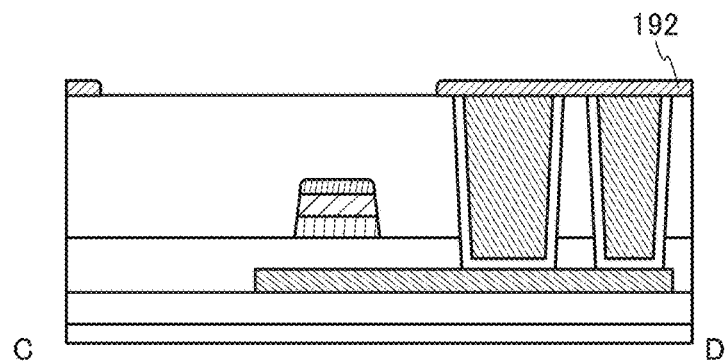

Next, a resist mask 192 is formed over the sample surface by a photolithography method (see FIG. 11C). With the use of the resist mask 192 as a mask, part of the insulating layer 163 is selectively removed to expose part of a surface of the oxide semiconductor layer 108a and part of the surface of the oxide semiconductor layer 108b to form the insulating layer 112 (see FIG. 12A).

Figure 12A:
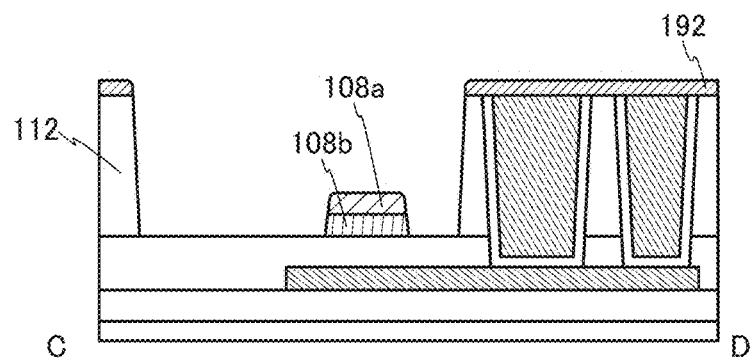
FIGS. 12A to 12C are cross-sectional views illustrating a method for manufacturing a transistor of one embodiment of the present invention.
Figure 12B:
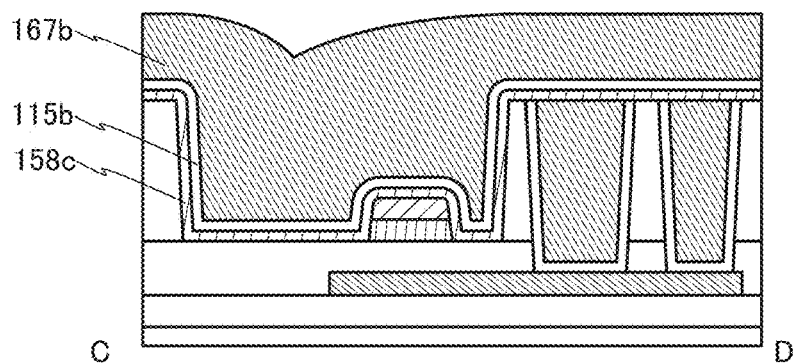

Next, after the resist mask 192 is removed, an oxide semiconductor layer 158c, an insulating layer 115b, and a conductive layer 167b are sequentially formed over the sample surface (see FIG. 12B). The insulating layer 115b may be formed by a method similar to that of the insulating layer 114. Furthermore, the conductive layer 167b may be formed by a method similar to that of the conductive layer 166.

Next, the sample surface is subjected to CMP treatment. By removing part of the conductive layer 167b with CMP treatment, the conductive layer 116 can be formed (see FIG. 12C). At this time, by removing part of the oxide semiconductor layer 158c, the oxide semiconductor layer 108c can be formed.

Then, by following a manufacturing method similar to that of the semiconductor device including the transistor 100, the conductive layer 126a, the conductive layer 126b, the conductive layer 126c, and the conductive layer 126d as well as the conductive layer 130a, the conductive layer 130b, the conductive layer 130c, and the conductive layer 130d are formed, thus, the semiconductor device including the transistor 100f shown in FIGS. 9A to 9C can be formed.

Figure 13A:
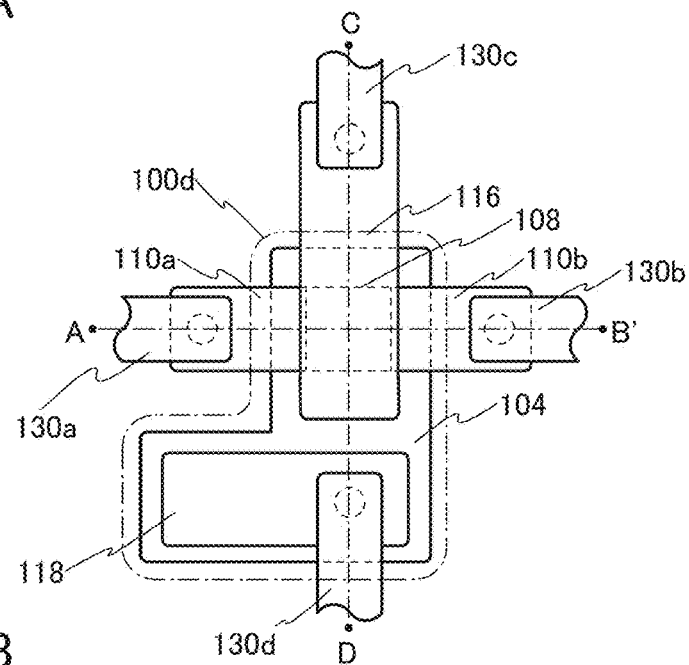
FIGS. 13A to 13C are a top view and cross-sectional views illustrating a transistor of one embodiment of the present invention.
Figure 13B:
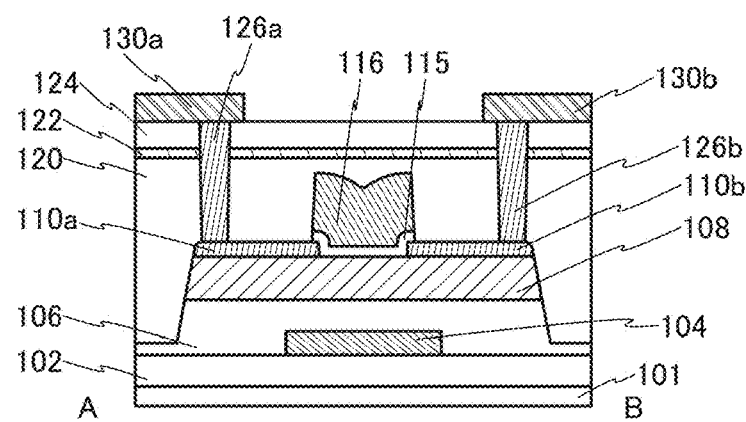
Figure 13C:
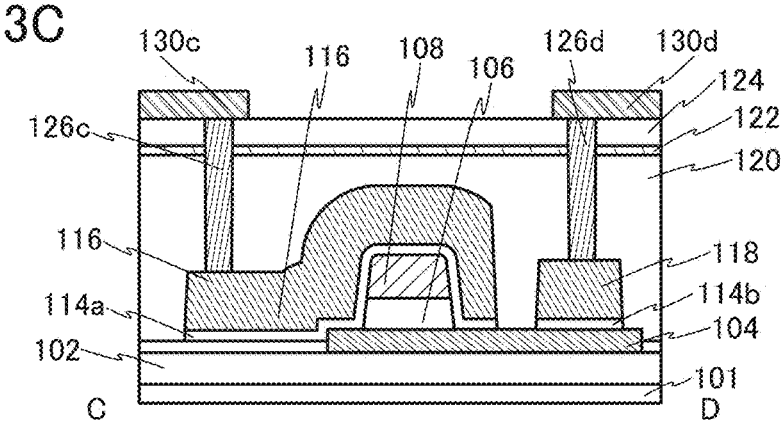

Next, a transistor 100d will be described with reference to FIGS. 13A to 13C. The method for manufacturing the transistor 100d differs from that of the transistor 100. FIG. 13A is a top view of the semiconductor device including the transistor 100d. FIG. 13B shows a cross section of the semiconductor device taken along the dashed-dotted line A-B in FIG. 13A. FIG. 13C shows a cross section of the semiconductor device taken along the dashed-dotted line C-D in FIG. 13A.

The transistor 100d is, like the transistor 100, provided over the substrate 101 and the insulating layer 102. The transistor 100d includes, like the transistor 100, the conductive layer 104, the insulating layer 106, the semiconductor layer 108, the conductive layer 110a, the conductive layer 110b, the insulating layer 114a, the insulating layer 114b, the conductive layer 116, and the conductive layer 118. Furthermore, the insulating layer 120, the insulating layer 122, the insulating layer 124, the conductive layers 126a to 126d, and the conductive layers 130a to 130d are provided over the transistor 100d. However, the shapes of the insulating layer 114a, the insulating layer 114b, the conductive layer 116, and the conductive layer 118 included in the transistor 100d and the shape of the insulating layer 120 over the transistor 100d differ from the shapes of the insulating layer 114a, the insulating layer 114b, the conductive layer 116, and the conductive layer 118 included in the transistor 100 and the shape of the insulating layer 120 over the transistor 100.

Next, a manufacturing method of the transistor 100d will be described with reference to FIGS. 14A to 14E and FIGS. 15A to 15C. Note that for steps which are not mentioned in the description of the manufacturing method of the transistor 100d, the manufacturing method of the transistor 100 can be referred to.

An A-B cross section in each of FIGS. 14A to 14E and FIGS. 15A to 15C corresponds to the cross section taken along dashed dotted line A-B in FIG. 13A. A C-D cross section in each of FIGS. 14A to 14E and FIGS. 15A to 15C corresponds to the cross section taken along dashed dotted line C-D in FIG. 13A.

Figure 14A:
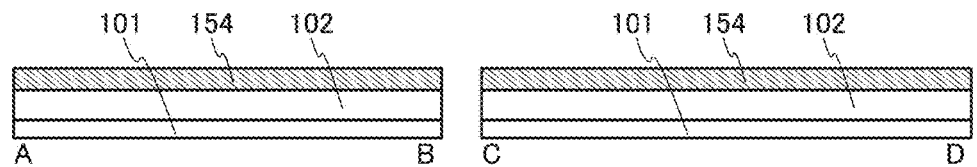
FIGS. 14A to 14E are cross-sectional views illustrating a method for manufacturing a transistor of one embodiment of the present invention.
Figure 14B:
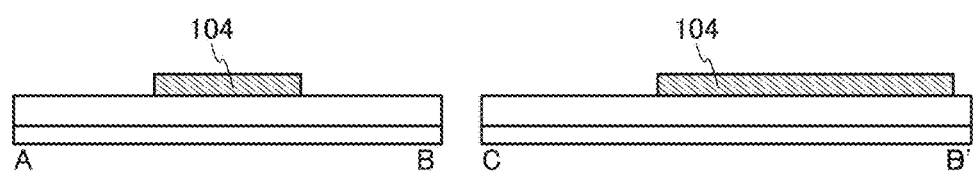
Figure 14C:
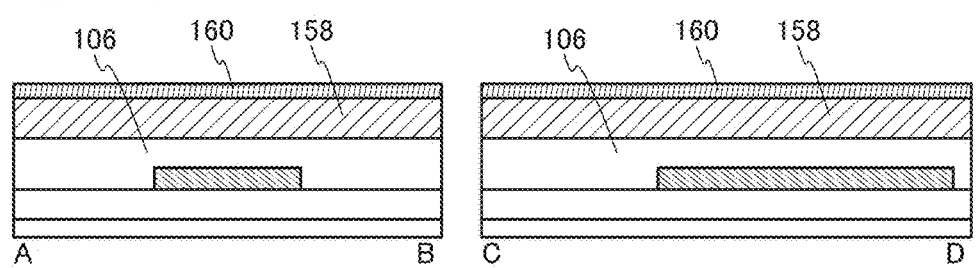
Figure 14D:
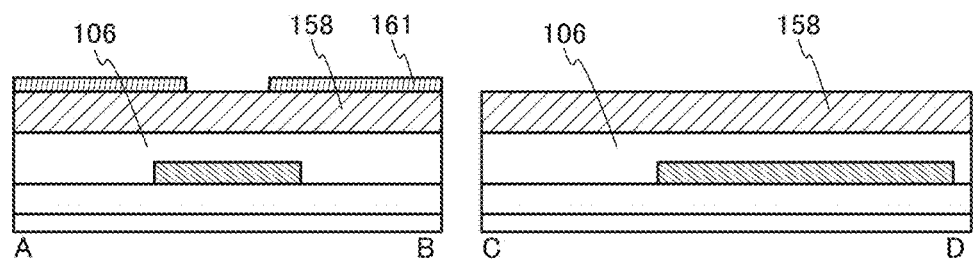
Figure 14E:
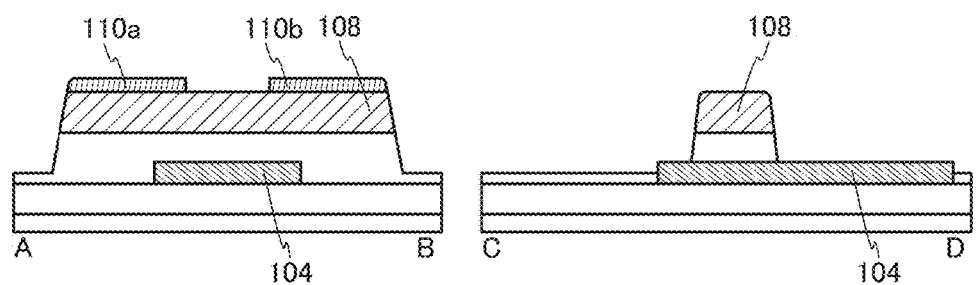

First, the conductive layer 104, the insulating layer 106, the semiconductor layer 158, and the conductive layer 160 are formed over the substrate 101 (see FIGS. 14A to 14C).

Next, a resist mask is formed over the sample surface by a photolithography method (not illustrated). With the use of the resist mask as a mask, part of the conductive layer 160 is selectively removed to form a conductive layer 161 (see FIG. 14D). At this time, part of the surface of the semiconductor layer 108 is also removed in some cases.

Next, a resist mask is formed over the sample surface by a photolithography method (not illustrated). With the use of the resist mask as a mask, part of the conductive layer 161 and part of the semiconductor layer 158 are selectively removed to form the conductive layer 110a, the conductive layer 110b, and the semiconductor layer 108. At this time, part of the insulating layer 106 is also etched to form a projection in the insulating layer 106, whereby a top surface of a region of part of the conductive layer 104 is exposed (see FIG. 14E).

Figure 15A:
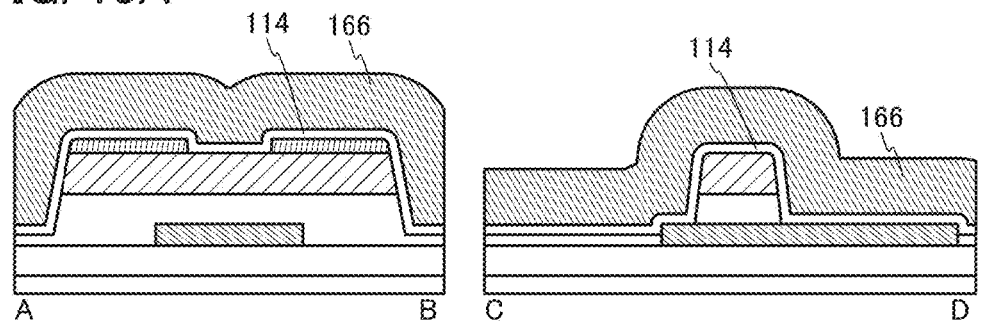
FIGS. 15A to 15C are cross-sectional views illustrating a method for manufacturing a transistor of one embodiment of the present invention.
Figure 15B:
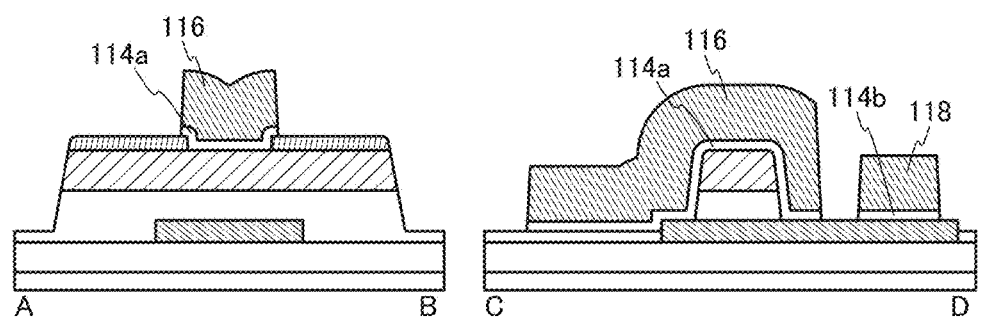

Next, the insulating layer 114 and the conductive layer 166 are sequentially formed over the sample surface (see FIG. 15A).

Next, a resist mask is formed over the sample surface by a photolithography method (not illustrated). With the use of the resist mask as a mask, part of the conductive layer 166 is selectively removed to form the conductive layer 116 and the conductive layer 118. Furthermore, part of the insulating layer 114 is selectively removed to form the insulating layer 114a and the insulating layer 114b (see FIG. 15B). However, part of the insulating layer 114 does not have to be removed, and the insulating layer 114a and the insulating layer 114b may be connected to each other.

Next, after the insulating layer 120 is formed over the sample surface, the sample surface is subjected to CMP treatment (not illustrated).

Figure 15C:
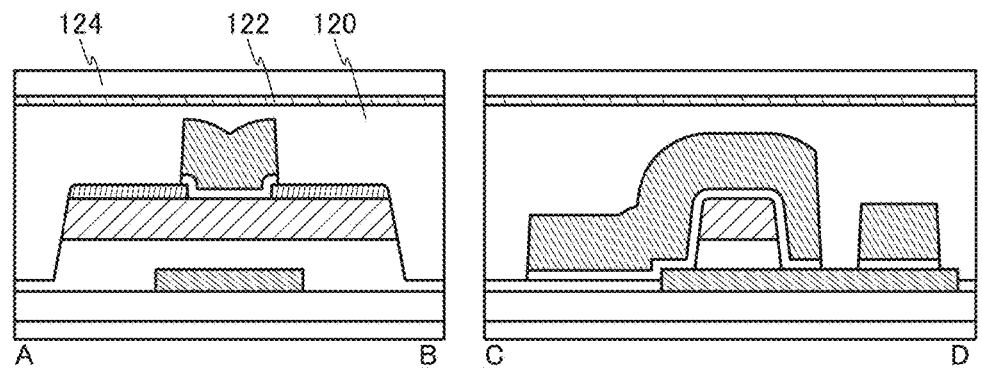

Next, the insulating layer 122 and the insulating layer 124 are formed over the sample surface (see FIG. 15C). Then, heat treatment may be performed after the formation of the insulating layer 122.

Then, by following a manufacturing method similar to that of the transistor 100, the conductive layer 126a, the conductive layer 126b, the conductive layer 126c, and the conductive layer 126d as well as the conductive layer 130a, the conductive layer 130b, the conductive layer 130c, and the conductive layer 130d are formed, thus, the semiconductor device including the transistor 100d shown in FIGS. 13A to 13C can be formed.

In order to form the conductive layers 116 and 118 of the transistor 100, the transistor 100b, the transistor 100c, and the transistor 100f, a material with high embeddability is preferably used; however, in the manufacturing method of the transistor 100d, the conductive layer 116 and the conductive layer 118 can be formed without using a material with embeddability. Accordingly, by employing the manufacturing method of the transistor 100d, options available for a material used for a conductive layer can be increased, which is preferable.

Figure 16A:
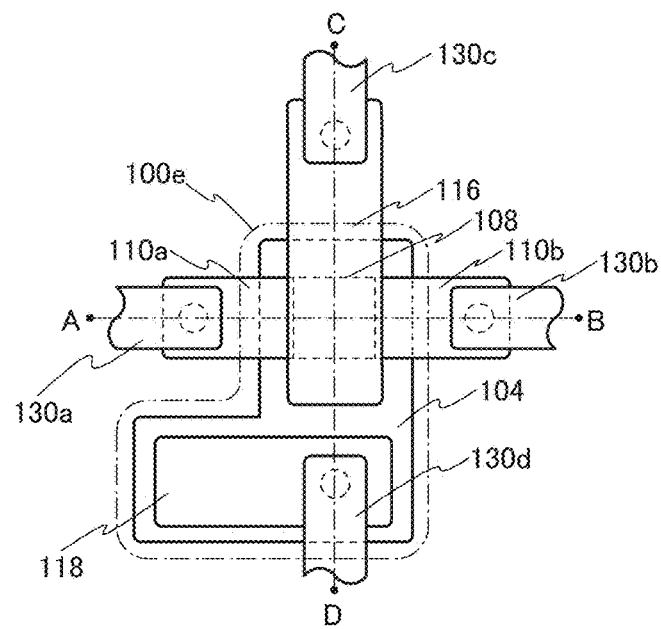
FIGS. 16A to 16C are a top view and cross-sectional views illustrating a transistor of one embodiment of the present invention.
Figure 16B:
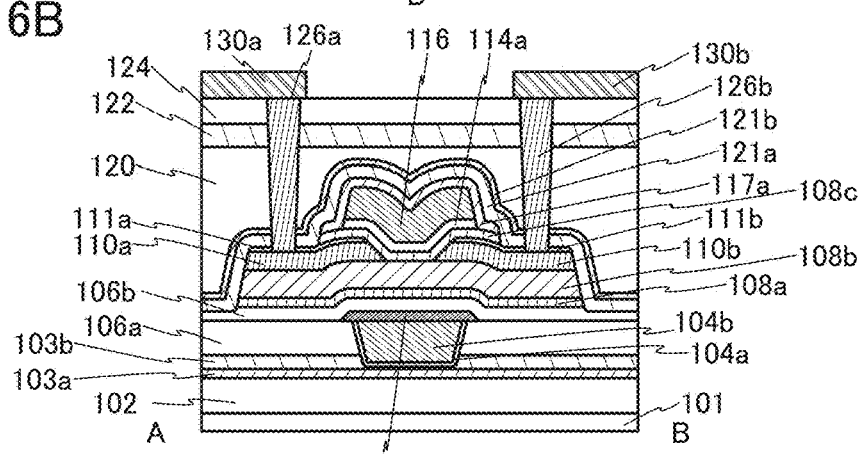
Figure 16C:
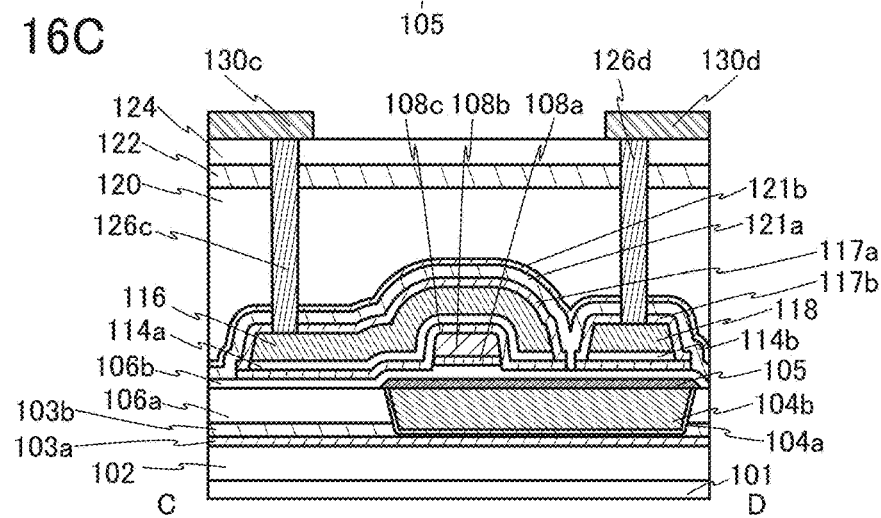

Next, the transistor 100e will be described with reference to FIGS. 16A to 16C. The transistor 100e is a transistor in which components have been added to the transistor 100d. FIG. 16A is a top view of the semiconductor device including the transistor 100e. FIG. 16B shows a cross section of the semiconductor device taken along the dashed-dotted line A-B in FIG. 16A. FIG. 16C shows a cross section of the semiconductor device taken along the dashed-dotted line C-D in FIG. 16A.

The transistor 100e is unlike the transistor 100d positioned over the substrate 101, the insulating layer 102, an insulating layer 103a, and an insulating layer 103b. The transistor 100e includes unlike the transistor 100d an insulating layer 106a, an insulating layer 106b, a conductive layer 104a, a conductive layer 104b, a protection layer 105, a protection layer 111a, a protection layer 111b, a protection layer 117a, a protection layer 117b, an insulating layer 121a, and an insulating layer 121b. The semiconductor layer of the transistor 100e is formed with a three-layered structure of the oxide semiconductor layer 108a, the oxide semiconductor layer 108b, and the oxide semiconductor layer 108c.

The insulating layer 102, the insulating layer 103a, and the insulating layer 103b are positioned over the substrate 101. The insulating layer 102 is positioned over the insulating layer 103b, and part of the insulating layer 103b and part of the insulating layer 106a are removed to provide the conductive layer 104a and the conductive layer 104b. Furthermore, the protection layer 105 is positioned over the conductive layer 104a and the conductive layer 104b. The insulating layer 106b is positioned over the protection layer 105 and the insulating layer 102. Additionally, the oxide semiconductor layer 108a is provided over the insulating layer 106b. The oxide semiconductor layer 108b is provided over the oxide semiconductor layer 108a.

The transistor 100e includes the oxide semiconductor layer 108c in contact with part of the oxide semiconductor layer 108b, the insulating layer 114a over the oxide semiconductor layer 108c, and the conductive layer 116 over the insulating layer 114a. The conductive layer 116 functions as a gate electrode. Furthermore, the transistor 100e includes the conductive layer 110a and the conductive layer 110b in contact with another part of the top surface of the oxide semiconductor layer 108b.

The transistor 100e includes the oxide semiconductor layer 108c provided over the insulating layer 106 and the conductive layer 118 over the oxide semiconductor layer 108c.

In the transistor 100e, the protection layer 117a is positioned over the conductive layer 116, the protection layer 111a is positioned over the conductive layer 110a, the protection layer 111b is positioned over the conductive layer 110b, and the protection layer 117b is positioned over the conductive layer 118.

In the transistor 100e, the insulating layer 121a and the insulating layer 121b are positioned over the insulating layer 106, the protection layer 117a, the protection layer 111a, the protection layer 111b, and the protection layer 117b. The insulating layer 120, the insulating layer 122, and the insulating layer 124 are positioned over the insulating layer 121b.

The conductive layers 130a to 130d are positioned over the insulating layer 124. The conductive layer 130a is electrically connected to the conductive layer 110a through the conductive layer 126a. The conductive layer 130b is electrically connected to the conductive layer 110b through the conductive layer 126b. The conductive layer 130c is electrically connected to the conductive layer 116 through the conductive layer 126c. The conductive layer 130d is electrically connected to the conductive layer 118 through the conductive layer 126d.

Specifically, the insulating layer 103a, the insulating layer 103b, the insulating layer 121a, the insulating layer 121b, and the insulating layer 122 are preferably formed using an insulating material with a function of suppressing the penetration of impurities and oxygen. For example, a single-layer structure or a stacked-layer structure including an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used.

Examples of the insulating material with a function of suppressing the penetration of impurities and oxygen include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When an insulating material with a function of suppressing the penetration of impurities and oxygen is used for the insulating layer 103a and the insulating layer 103b, impurity diffusion from the substrate 101 side to the semiconductor layer 108 can be suppressed, and the reliability of the transistor can be improved. When an insulating material with a function of suppressing the penetration of impurities and oxygen is used for the insulating layer 122, impurity diffusion from a layer above the insulating layer 122 to the semiconductor layer 108 can be suppressed, and the reliability of the transistor can be improved.

An impurity here is typified by hydrogen and water.

By using a material that does not easily release oxygen and/or does not easily absorb oxygen for the protection layer 105, the protection layer 111a, the protection layer 111b, the protection layer 117a, and the protection layer 117b, oxidation of the conductive layer 104a, the conductive layer 104b, the conductive layer 110a, the conductive layer 110b, the conductive layer 116, and the conductive layer 118 can be suppressed, and the degradation of the transistor characteristics can be suppressed which might occur due to the oxidation of the conductive layer 104a, the conductive layer 104b, the conductive layer 110a, the conductive layer 110b, the conductive layer 116, and the conductive layer 118.

For the protection layer 105, the protection layer 111a, the protection layer 111b, the protection layer 117a, and the protection layer 117b, an insulating material or a conductive material may be used.

This embodiment can be implemented in an appropriate combination with any of the structures described in the other embodiments, example, and the like.

(Embodiment 2)

<Structure of Semiconductor Device>

In this embodiment, an example of a semiconductor device including any of the transistors disclosed in this specification and the like is described.

Figure 17:
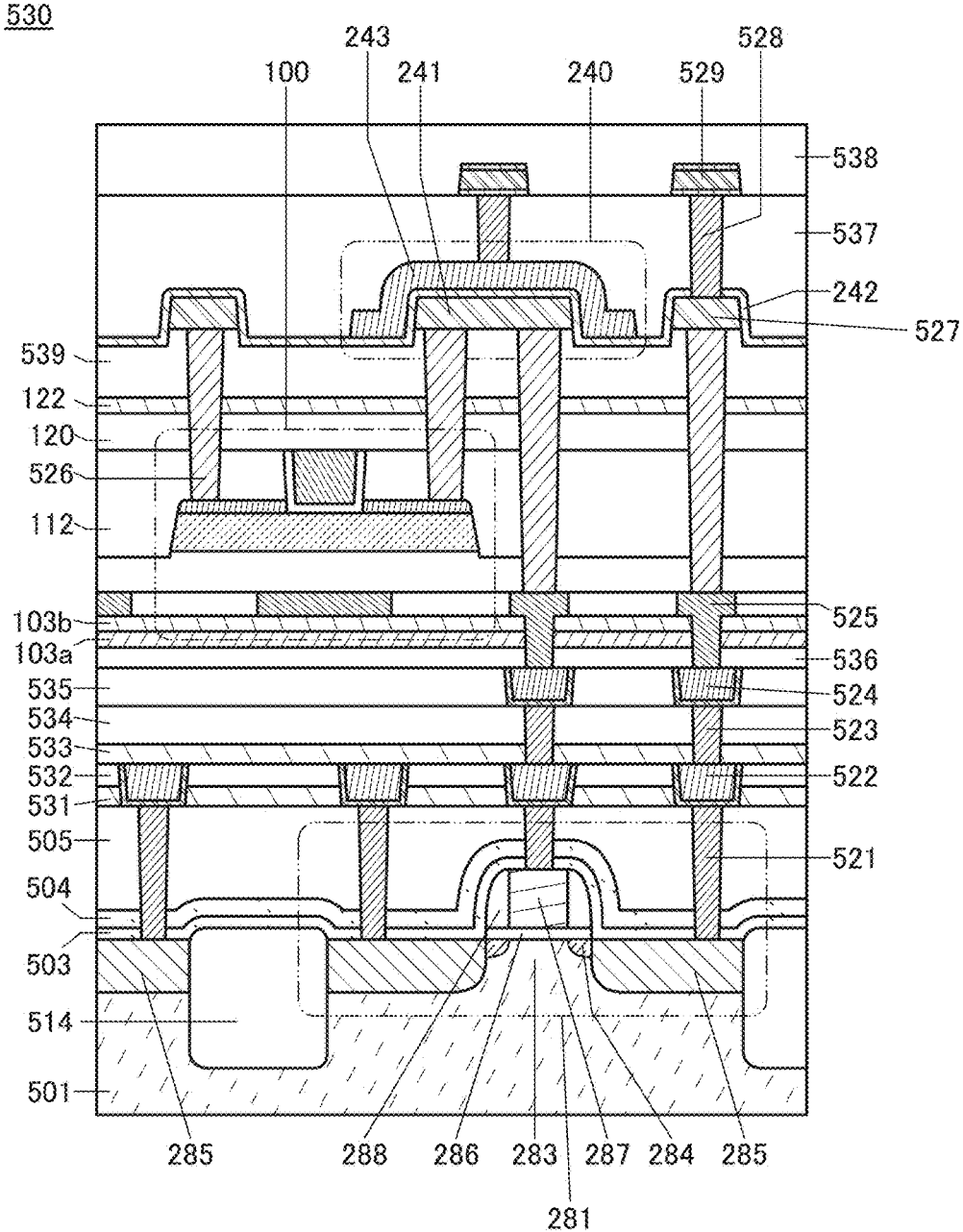
FIG. 17 illustrates a semiconductor device of one embodiment of the present invention.

FIG. 17 is a cross-sectional view of a semiconductor device 530. The semiconductor device 530 includes the transistor 100, a transistor 281, and a capacitor 240.

In the semiconductor device 530, an n-type semiconductor is used for a substrate 501. The transistor 281 includes a channel formation region 283, high-concentration p-type impurity regions 285, an insulating layer 286, a conductive layer 287, and a sidewall 288. In regions overlapping with the sidewall 288 with the insulating layer 286 located therebetween, low-concentration p-type impurity regions 284 are provided. The insulating layer 286 can function as a gate insulating layer. The conductive layer 287 can function as a gate. The channel formation region 283 of the transistor 281 is formed in part of the substrate 501.

The low-concentration p-type impurity regions 284 can be formed in such a manner that an impurity element is added with the use of the conductive layer 287 as a mask after formation of the conductive layer 287 and before the formation of the sidewall 288. In other words, the low-concentration p-type impurity regions 284 can be formed in a self-aligned manner. After the sidewall 288 is formed, the high-concentration p-type impurity regions 285 are formed. Note that the low-concentration p-type impurity regions 284 have the same conductivity type as the high-concentration p-type impurity regions 285, and have a lower concentration of the impurity imparting the conductivity type than the high-concentration p-type impurity regions 285. The low-concentration p-type impurity regions 284 are not necessarily provided depending on circumstances.

The transistor 281 is electrically isolated from other transistors by an element isolation layer 514. An element isolation region can be formed by a local oxidation of silicon (LOCOS) method, a shallow trench isolation (STI) method, or the like.

In the semiconductor device 530, an insulating layer 531, an insulating layer 532, an insulating layer 533, an insulating layer 534, an insulating layer 535, and an insulating layer 536 are provided over an insulating layer 505 covering the transistor 281. In addition, the semiconductor device 530 includes a conductive layer 522 and a conductive layer 524 over the insulating layer 505.

The conductive layer 522 is provided to be embedded in the insulating layers 531 and 532. The conductive layer 522 is electrically connected to the transistor 281 through a conductive layer 521 provided in the insulating layers 503, 504, and 505.

The conductive layer 524 is provided to be embedded in the insulating layer 535. The conductive layer 524 is electrically connected to the conductive layer 522 through a conductive layer 523 provided in the insulating layers 533 and 534.

In the semiconductor device 530, the transistor 100 is provided over the insulating layer 536 with the insulating layer 103a and the insulating layer 103b located therebetween. Furthermore, the insulating layer 120, the insulating layer 122, and the insulating layer 539 are provided over the transistor 100, and the conductive layer 527 and the conductive layer 241 are provided over the insulating layer 539. An insulating layer 242 covering the conductive layers 527 and 241 is provided. Furthermore, a conductive layer 243 covering the conductive layer 241 is provided over the insulating layer 242.

A region where the conductive layer 241, the insulating layer 242, and the conductive layer 243 overlap with each other functions as the capacitor 240. By providing the conductive layer 243 to cover the conductive layer 241, not only a top surface but also side surfaces of the conductive layer 241 can function as the capacitor.

The conductive layer 527 is electrically connected to a source or a drain of the transistor 100 through the conductive layer 526 provided in part of the insulating layer 539, the insulating layer 122, the insulating layer 120, and the insulating layer 112.

An insulating layer 537 is provided over the conductive layer 243 and the insulating layer 242, a conductive layer 529 is provided over the insulating layer 537, and an insulating layer 538 is provided over the conductive layer 529. The conductive layer 529 is electrically connected to the conductive layer 527 through the conductive layer 528 provided in part of the insulating layer 537.

The insulating layers 531, 532, 533, 534, 535, 536, 539, 242, 537, and 538 can be formed using a material and a method which are similar to those of the insulating layers described in the above embodiment and the like. The conductive layers 521, 522, 523, 524, 525, 526, 527, 241, 243, 528, and 529 can be formed using a material and a method which are similar to those of the conductive layers described in the above embodiment and the like.

The conductive layers 521, 522, 523, 524, 525, 526, 527, 528, and 529 may be formed by a damascene method, a dual damascene method, or the like.

This embodiment can be implemented in an appropriate combination with any of the structures described in the other embodiments, example, and the like.

[Example 1 of Memory Element]

Figure 18A:
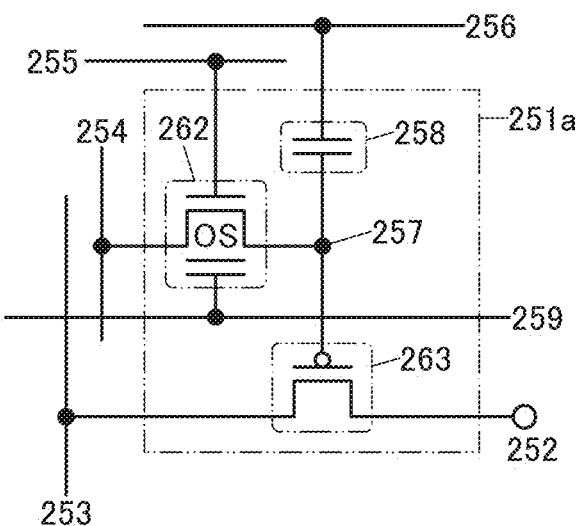
FIGS. 18A and 18B are each a circuit diagram of a semiconductor device of one embodiment of the present invention.

The semiconductor circuit illustrated in FIG. 18A has a configuration of a memory element 251a in which one of a source and a drain of a transistor 262 is connected to a gate of a transistor 263 and one electrode of a capacitor 258. The circuit illustrated in FIG. 18B has a configuration of a memory element 261a in which one of the source and the drain of the transistor 262 is connected to one electrode of the capacitor 258.

In each of the memory elements 251a and 261a, charges injected through the wiring 254 and the transistor 262 can be held at a node 257. The transistor 262 is an OS transistor, which enables charges to be held at the node 257 for a long period.

The memory element 251a includes the transistor 263. Although the transistor 263 is a p-channel transistor in FIG. 18A, the transistor 263 may be an n-channel transistor. For example, the transistor 281 or the transistor 282 may be used as the transistor 263. An OS transistor may also be used as the transistor 263.

Figure 18B:
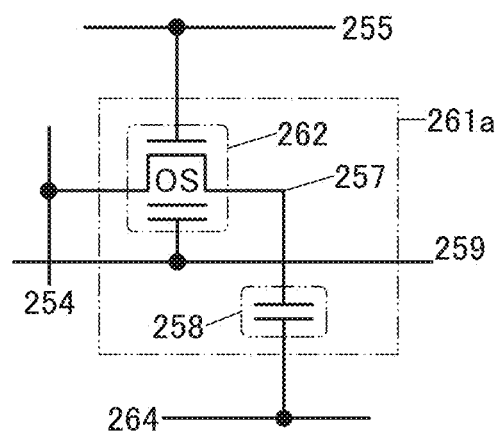

The memory element 251a illustrated in FIG. 18A and the memory element 261a illustrated in FIG. 18B are described in detail here.

The memory element 251a includes the transistor 263 using a first semiconductor, the transistor 262 using a second semiconductor, and the capacitor 258.

As the transistor 262, any of the OS transistors disclosed in the above embodiment can be used. When a transistor having a low off-state current is used as the transistor 262, data can be held at the node 257 for a long period. In other words, power consumption of the memory element can be reduced because refresh operation becomes unnecessary or the frequency of refresh operation can be extremely low.

In FIG. 18A, a wiring 252 is electrically connected to one of a source and a drain of the transistor 263, and a wiring 253 is electrically connected to the other of the source and the drain of the transistor 263. The wiring 254 is electrically connected to one of the source and the drain of the transistor 262, and a wiring 255 is electrically connected to a gate of the transistor 262. The gate of the transistor 263, the other of the source and the drain of the transistor 262, and the one electrode of the capacitor 258 are electrically connected to the node 257. A wiring 256 is electrically connected to the other electrode of the capacitor 258. A control gate is electrically connected to a wiring 259. By controlling the potential supplied to the wiring 259, the threshold voltage of the transistor 262 can be appropriately changed.

The memory element 251a in FIG. 18A has a feature that the charges supplied to the node 257 can be held, and thus enables writing, holding, and reading of data as follows.

[Writing and Holding Operations]

Data writing and holding operations of the memory element 251a will be described. First, the potential of the wiring 255 is set to a potential at which the transistor 262 is on. Accordingly, the potential of the wiring 254 is supplied to the node 257. That is, a predetermined charge is supplied to the node 257 (writing). Here, one of two kinds of charges providing different potential levels (hereinafter also referred to as a "low-level charge" and a "high-level charge") is supplied. After that, the potential of the wiring 255 is set to a potential at which the transistor 262 is off. Thus, the charge is held at the node 257 (holding operation).

Note that the high-level charge is a charge for supplying a higher potential to the node 257 than the low-level charge.

In the case where the transistor 263 is a p-channel transistor, each of the high-level and low-level charges is a charge for supplying a potential higher than the threshold voltage of the transistor 263. In the case where the transistor 263 is an n-channel transistor, each of the high-level and low-level charges is a charge for supplying a potential lower than the threshold voltage of the transistor 263. In other words, each of the high-level and low-level charges is a charge for supplying a potential at which the transistor 263 is off.

[Reading Operation 1]

Next, operation of reading data will be described. A reading potential $V_R$ is supplied to the wiring 256 while a predetermined potential (a constant potential) different from the potential of the wiring 253 is supplied to the wiring 252, whereby data held at the node 257 can be read.

The reading potential $V_R$ is set to $\{(V_{th}-V_H)+(V_{th}+V_L)\}/2$, where $V_H$ is the potential supplied in the case of the high-level charge and $V_L$ is the potential supplied in the case of the low-level charge. Note that the potential of the wiring 256 in a period during which data is not read is set to a potential higher than $V_H$ in the case where the transistor 263 is a p-channel transistor, and is set to a potential lower than $V_L$ in the case where the transistor 263 is an n-channel transistor.

For example, in the case where the transistor 263 is a p-channel transistor, $V_R$ is −2 V when $V_{th}$ of the transistor 263 is −2 V, $V_H$ is 1 V, and $V_L$ is −1 V. When the potential written to the node 257 is $V_H$ and $V_R$ is applied to the wiring 256, $V_R+V_H$, i.e., −1 V, is applied to the gate of the transistor 263. Since −1 V is higher than $V_{th}$, the transistor 263 is not turned on. Thus, the potential of the wiring 253 is not changed. When the potential written to the node 257 is $V_L$ and $V_R$ is applied to the wiring 256, $V_R+V_L$, i.e., −3 V, is applied to the gate of the transistor 263. Since −3 V is lower than $V_{th}$, the transistor 263 is turned on. Thus, the potential of the wiring 253 is changed.

In the case where the transistor 263 is an n-channel transistor, $V_R$ is 2 V when $V_{th}$ of the transistor 263 is 2 V, $V_H$ is 1 V, and $V_L$ is −1 V. When the potential written to the node 257 is $V_H$ and $V_R$ is applied to the wiring 256, $V_R+V_H$, i.e., 3 V, is applied to the gate of the transistor 263. Since 3 V is higher than $V_{th}$, the transistor 263 is turned on. Thus, the potential of the wiring 253 is changed. When the potential written to the node 257 is $V_L$ and $V_R$ is applied to the wiring 256, $V_R+V_L$, i.e., 1 V, is applied to the gate of the transistor 263. Since 1 V is lower than $V_{th}$, the transistor 263 is not turned on. Thus, the potential of the wiring 253 is not changed.

By determining the potential of the wiring 253, data held at the node 257 can be read.

The memory element 261a illustrated in FIG. 18B is different from the memory element 251a in that the transistor 263 is not provided. The other electrode of the capacitor 258 is electrically connected to a wiring 264. The potential of the wiring 264 may be any potential as long as it is a fixed potential. For example, the wiring 264 may be supplied with GND. Data can be written to the memory element 261a in a manner similar to that of the memory element 251a.

[Reading Operation 2]

Operation of reading data of the memory element 261a will be described. When a potential at which the transistor 262 is turned on is supplied to the wiring 255, the wiring 254 which is in a floating state and the capacitor 258 are brought into conduction, and the charge is redistributed between the wiring 254 and the capacitor 258. As a result, the potential of the wiring 254 is changed. The amount of change in the potential of the wiring 254 varies depending on the potential of the node 257 (or the charge accumulated in the node 257).

For example, the potential of the wiring 254 after the charge redistribution is $(C_B \times V_{B0}+C \times V)/(C_B+C)$, where V is the potential of the node 257, C is the capacitance of the capacitor 258, $C_B$ is the capacitance component of the wiring 254, and $V_{B0}$ is the potential of the wiring 254 before the charge redistribution. Thus, it can be found that, assuming that the memory cell is in either of two states in which the potential of the node 257 is $V_1$ and $V_0$ ($V_1>V_0$), the potential of the wiring 254 in the case of holding the potential $V_1$ ($=(C_B \times V_{B0}+C \times V_1)/(C_B+C)$) is higher than the potential of the wiring 254 in the case of holding the potential $V_0$ ($=(C_B \times V_{B0}+C \times V_0)/(C_B+C)$).

Then, by comparing the potential of the wiring 254 with a predetermined potential, data can be read.

When including a transistor using an oxide semiconductor and having an extremely low off-state current, the memory element described above can hold stored data for a long time. In other words, refresh operation becomes unnecessary or the frequency of the refresh operation can be extremely low, which leads to a sufficient reduction in power consumption. Moreover, stored data can be held for a long time even when power is not supplied (note that a potential is preferably fixed).

This embodiment can be implemented in an appropriate combination with any of the structures described in the other embodiments, example, and the like.

(Embodiment 3)

<Electronic Device>

A semiconductor device of one embodiment of the present invention can be used for a variety of electronic devices. FIGS. 19A to 19G illustrate specific examples of electronic devices including the semiconductor device of one embodiment of the present invention.

Figure 19A:
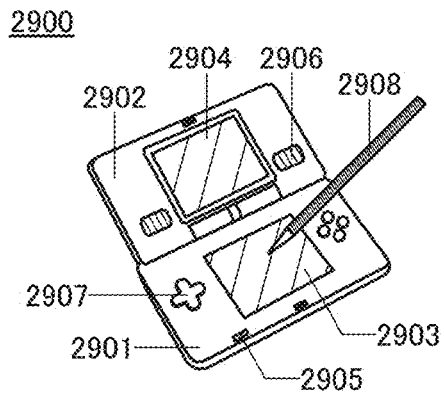
FIGS. 19A to 19G are diagrams illustrating electronic devices of one embodiment of the present invention.

A portable game machine 2900 illustrated in FIG. 19A includes a housing 2901, a housing 2902, a display portion 2903, a display portion 2904, a microphone 2905, a speaker 2906, an operation switch 2907, and the like. In addition, the portable game machine 2900 includes an antenna, a battery, and the like inside the housing 2901. Although the portable game machine in FIG. 19A has the two display portions 2903 and 2904, the number of display portions included in a portable game machine is not limited to this. The display portion 2903 is provided with a touch screen as an input device, which can be handled with a stylus 2908 or the like.

By using the semiconductor device described in Embodiment 1 for the portable game machine 2900, the overall power consumption of the portable game machine 2900 can be reduced. Furthermore, a memory device using the semiconductor device makes it possible to hold control data, a control program, and the like of the portable game machine 2900 for a long period of time.

Figure 19B:
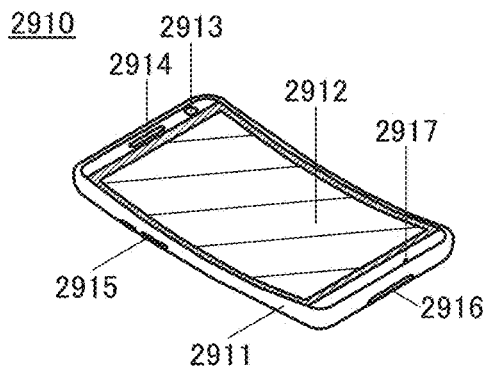

An information terminal 2910 illustrated in FIG. 19B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In addition, the information terminal 2910 includes an antenna, a battery, and the like inside the housing 2911. The information terminal 2910 can be used as, for example, a smartphone, a mobile phone, a tablet information terminal, a tablet personal computer, or an e-book reader.

By using the semiconductor device described in Embodiment 1 for the information terminal 2910, the overall power consumption of the information terminal 2910 can be reduced. Furthermore, a memory device using the semiconductor device makes it possible to hold control data, a control program, and the like of the information terminal 2910 for a long period of time.

Figure 19C:
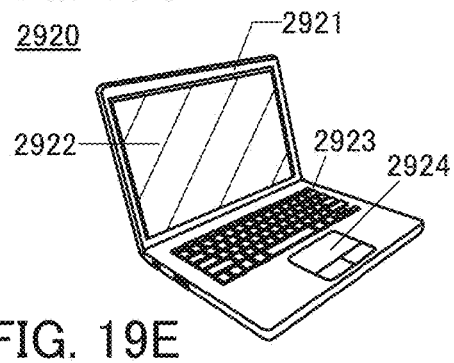

A notebook personal computer 2920 illustrated in FIG. 19C includes a housing 2921, a display portion 2922, a keyboard 2923, a pointing device 2924, and the like. In addition, the notebook personal computer 2920 includes an antenna, a battery, and the like inside the housing 2921.

By using the semiconductor device described in Embodiment 1 for the notebook personal computer 2920, the overall power consumption of the notebook personal computer 2920 can be reduced. Furthermore, a memory device using the semiconductor device makes it possible to hold control data, a control program, and the like of the notebook personal computer 2920 for a long period of time.

Figure 19D:
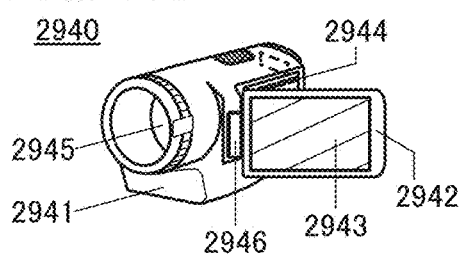

A video camera 2940 in FIG. 19D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In addition, the video camera 2940 includes an antenna, a battery, and the like inside the housing 2941. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image may be switched depending on the angle between the housings 2941 and 2942.

By using the semiconductor device described in Embodiment 1 for the video camera 2940, the overall power consumption of the video camera 2940 can be reduced. Furthermore, a memory device using the semiconductor device makes it possible to hold control data, a control program, and the like of the video camera 2940 for a long period of time.

Figure 19E:
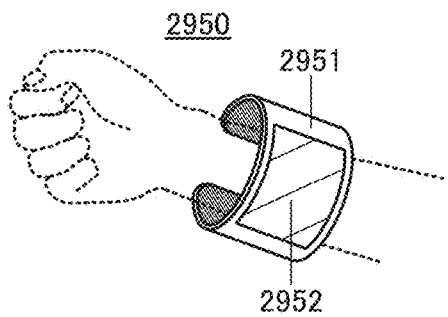

FIG. 19E illustrates an example of a bangle-type information terminal. An information terminal 2950 includes a housing 2951, a display portion 2952, and the like. In addition, the information terminal 2950 includes an antenna, a battery, and the like inside the housing 2951. The display portion 2952 is supported by the housing 2951 having a curved surface. A display panel formed with a flexible substrate is provided in the display portion 2952, whereby the information terminal 2950 can be a user-friendly information terminal that is flexible and lightweight.

By using the semiconductor device described in Embodiment 1 for the information terminal 2950, the overall power consumption of the information terminal 2950 can be reduced. Furthermore, a memory device using the semiconductor device makes it possible to hold control data, a control program, and the like of the information terminal 2950 for a long period of time.

Figure 19F:
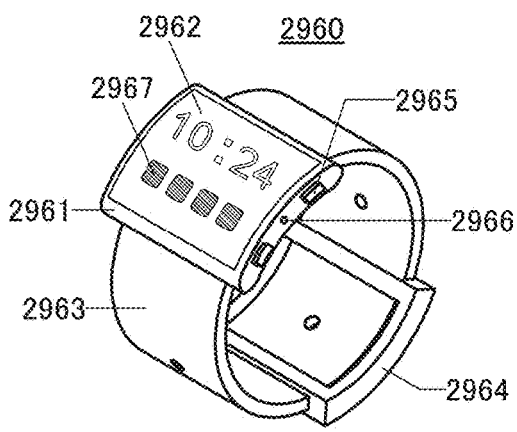

FIG. 19F illustrates an example of a watch-type information terminal. An information terminal 2960 includes a housing 2961, a display portion 2962, a band 2963, a buckle 2964, an operation switch 2965, an input/output terminal 2966, and the like. In addition, the information terminal 2960 includes an antenna, a battery, and the like inside the housing 2961. The information terminal 2960 is capable of executing a variety of applications such as mobile phone calls, e-mailing, text viewing and editing, music reproduction, Internet communication, and computer games.

The display surface of the display portion 2962 is bent, and images can be displayed on the bent display surface. Furthermore, the display portion 2962 includes a touch sensor, and operation can be performed by touching the screen with a finger, a stylus, or the like. For example, an application can be started by touching an icon 2967 displayed on the display portion 2962. With the operation switch 2965, a variety of functions such as time setting, ON/OFF of the power, ON/OFF of wireless communication, setting and cancellation of a silent mode, and setting and cancellation of a power saving mode can be performed. For example, the functions of the operation switch 2965 can be set by setting the operating system incorporated in the information terminal 2960.

The information terminal 2960 can employ near field communication that is a communication method based on an existing communication standard. In that case, for example, mutual communication between the portable information terminal 7800 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

By using the semiconductor device described in Embodiment 1 for the information terminal 2960, the overall power consumption of the information terminal 2960 can be reduced. Furthermore, a memory device using the semiconductor device makes it possible to hold control data, a control program, and the like of the information terminal 2960 for a long period of time.

Figure 19G:
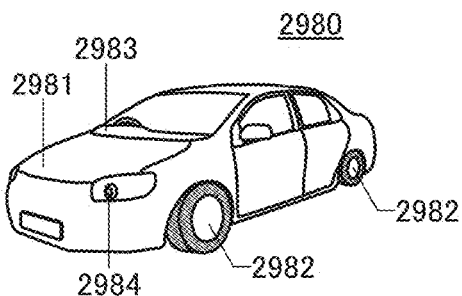

FIG. 19G is an external view illustrating an example of a car. A car 2980 includes a car body 2981, wheels 2982, a dashboard 2983, lights 2984, and the like. The car 2980 includes an antenna, a battery, and the like.

By using the semiconductor device described in Embodiment 1 for the car 2980, the overall power consumption of the car 2980 can be reduced. Furthermore, a memory device using the semiconductor device makes it possible to hold control data, a control program, and the like of the car 2980 for a long period of time.

This embodiment can be implemented in an appropriate combination with any of the structures described in the other embodiments, example, and the like.

[Example 1]

A transistor described in Embodiment 1 was fabricated, and described here are results of observations of a cross section of the transistor and measurements of electrical characteristics of the transistor.

In this example, the transistor was formed by a method described in Embodiment 1 with a structure similar to that of the transistor 100$f$ shown in FIGS. 9A to 9C. In other words, the transistor in this example includes, like the transistor 100$b$, a second control gate and includes, like the transistor 100$c$, a semiconductor layer which has a three-layered structure of the oxide semiconductor layer 108$a$, the oxide semiconductor layer 108$b$, and the oxide semiconductor layer 108$c$.

As for the conductive layer 154 to be the conductive layer 104, a 25-nm-thick tantalum nitride film was formed by a sputtering method (see FIG. 4A). The tantalum nitride film was formed under the following conditions: the pressure in a chamber was 0.6 Pa; a DC power source was used and the power was 1 kW; the sputtering gas flow rates of an Ar gas and a nitrogen gas were 50 sccm and 10 sccm, respectively;

the distance between the substrate and the target was 60 mm; and the substrate heating temperature was set to room temperature.

An organic resin and a resist were applied onto the tantalum nitride film, and a resist mask was formed by lithography using an electron beam (EB) exposure system. The organic resin and the tantalum nitride film were processed by an ICP dry etching method using the resist mask. The processing was performed for 22 seconds under the following conditions: the etching gas flow rates of chlorine and tetrafluoromethane were 60 sccm and 40 sccm, respectively; ICP was 2000 W; Bias was 50 W; the substrate temperature was 40° C.; and the pressure was 0.67 Pa.

As the insulating layer 106, a 40-nm-thick silicon oxynitride film was formed by a plasma CVD method (see FIG. 4C). The silicon oxynitride film was formed under the following conditions: the deposition gas flow rates of silane and dinitrogen monoxide were 5 sccm and 1000 sccm, respectively; the pressure in a chamber was controlled to be 133.30 Pa using a diaphragm-type baratron sensor and an APC valve; the RF power frequency was 13.56 MHz; the power was 45 W; the distance between electrodes was 20 mm; and the substrate heating temperature was 325° C.

After the deposition of the silicon oxynitride film, planarization treatment was performed by a CMP method to make the silicon oxynitride film over the tantalum nitride film 40-nm-thick.

The first oxide semiconductor layer to be the oxide semiconductor layer 108a was formed to a thickness of 5 nm by a sputtering method using a target of In:Ga:Zn=1:3:4 (atomic ratio) (not illustrated). The oxide semiconductor layer 108a was formed under the following conditions: the pressure in a chamber was 0.7 Pa; a DC power source was used and the power was 0.5 kW; the sputtering gas flow rate of an oxygen gas 45 sccm; the distance between the sample and the target was 60 mm; and the substrate heating temperature was 200° C.

The second oxide semiconductor layer to be the oxide semiconductor layer 108b was formed to a thickness of 15 nm by a sputtering method using a target of In:Ga:Zn=4:2:3 (not illustrated). The oxide semiconductor layer 108b was formed under the following conditions: the pressure in a chamber was 0.7 Pa; a DC power source was used and the power was 0.5 kW; the sputtering gas flow rates of an Ar gas and an oxygen gas were 30 sccm and 15 sccm, respectively; the distance between the sample and the target was 60 mm; and the substrate heating temperature was 200° C.

As the conductive layer 160, a 20-nm-thick tungsten film was formed by a sputtering method (see FIG. 4C). The tungsten film was formed under the following conditions: the pressure in a chamber was 0.4 Pa; a DC power source was used and the power was 1 kW; the sputtering gas flow rates of an Ar gas and a heated Ar gas were 50 sccm and 10 sccm, respectively; the distance between the substrate and the target was 60 mm; and the substrate heating temperature was 130° C.

An organic resin and a resist were applied onto the tungsten film, and a resist mask was formed by lithography using an EB exposure system. The organic resin and the tungsten film were processed by an ICP dry etching method using the resist mask. The processing was performed for 16 seconds under the following conditions: the etching gas flow rates of chlorine and tetrafluoromethane were 60 sccm and 40 sccm, respectively; ICP was 2000 W; Bias was 50 W; the substrate temperature was −10° C.; and the pressure was 0.67 Pa.

Then, the first oxide semiconductor layer to be the oxide semiconductor layer 108a and the second oxide semiconductor layer to be the oxide semiconductor layer 108b were processed by a dry etching method using end-point detection under the following conditions: the etching gas flow rates of methane and an Ar gas were 16 sccm and 32 sccm, respectively; ICP was 600 W; Bias was 50 W; and the substrate heating temperature was 70° C.

As the insulating layer 162, a silicon oxynitride film was formed by a plasma CVD method (see FIG. 4E). The silicon oxynitride film was formed to a thickness of 350 nm under the following conditions: the deposition gas flow rates of silane and dinitrogen monoxide were 5 sccm and 1000 sccm, respectively; the pressure in a chamber was controlled to be 133.30 Pa using a diaphragm-type baratron sensor and an APC valve; the RF power frequency was 13.56 MHz; the power was 45 W; the distance between electrodes was 20 mm; and the substrate heating temperature was 325° C.

After the deposition of the silicon oxynitride film, planarization treatment was performed by a CMP method.

Then, after the planarization treatment, a stacked layer of a tungsten film and a silicon oxynitride film was deposited as a hard mask over the silicon oxynitride film. Afterwards, an organic resin and a chemically amplified resist were applied, a resist mask was formed by lithography using an EB exposure system, and the hard mask was patterned to form the mask 191 (see FIG. 10B). Next, the silicon oxynitride film was processed by an ICP dry etching method using the mask 191 made of the resist mask and the hard mask (see FIG. 10C).

The ICP dry etching method was performed for 42 seconds under the following conditions: the etching gas flow rates of argon, oxygen, and hexafluoro-1,3-butadiene were 800 sccm, 30 sccm, and 22 sccm, respectively; the power of the RF power source was 500 W on the upper side and 1150 W on the lower side; the substrate temperature was 20° C.; and the pressure was 3.3 Pa.

As the insulating layer 115a, a silicon oxynitride film was formed by a plasma CVD method. The silicon oxynitride film was formed to a thickness of 10 nm under the following conditions: the deposition gas flow rates of silane and dinitrogen monoxide were 1 sccm and 800 sccm, respectively; the pressure in a chamber was controlled to be 40 Pa using a diaphragm-type baratron sensor and an APC valve; the RF power frequency was 60 MHz; the power was 150 W; the distance between electrodes was 28 mm; and the substrate heating temperature was 400° C.

As for the conductive layer 167a, a 5-nm-thick titanium nitride film formed by an ALD method and a 250-nm-thick tungsten film formed by a metal CVD method were formed (see FIG. 11A).

The deposition conditions of the titanium nitride film were as follows: titanium tetrachloride was introduced at a flow rate of 50 sccm for 0.05 sec so as to be adsorbed onto the insulating layer, and a nitrogen gas was introduced at a flow rate of 4500 sccm for 0.2 sec for purge treatment; next, an ammonia gas was introduced at a flow rate of 2700 sccm for 0.3 sec so as to be adsorbed onto the insulating layer, and then a nitrogen gas was introduced at a flow rate of 4000 sccm for 0.3 sec. These steps were regarded as one cycle, and the film thickness was controlled by changing the number of cycles. Furthermore, the substrate stage temperature was 412° C., the pressure was 667 Pa, and the distance between the substrate stage and the gas injection stage was 3 mm.

A 41-nm-thick tungsten film was deposited in 15 sec under the following conditions: the deposition gas flow rate of tungsten hexafluoride was 250 sccm and the deposition gas flow rates of hydrogen were 2200 sccm and 1700 sccm (for two gas lines), the deposition gas flow rate of argon was 2000 sccm, the deposition gas flow rate of nitrogen was 200 sccm, and the deposition gas flow rate of argon for the rear side of the stage was 4000 sccm, the pressure in a chamber was 10666 Pa, and the temperature of the substrate stage was 390° C.

After the deposition of the titanium nitride film and the tungsten film, planarization treatment was performed by a CMP method until the silicon oxynitride film was exposed (see FIG. 11B).

After the planarization treatment, an organic resin film and a chemically amplified resist were applied onto the silicon oxynitride film, and a resist mask 192 was formed by lithography using an EB exposure system (see FIG. 11C). The silicon oxynitride film is processed by an ICP dry etching method using the resist mask 192.

Then, the tungsten film exposed by the above steps was processed by an ICP dry etching method. The etching was performed for 20 seconds under the following conditions: the pressure was 2.0 Pa; the power of the RF power source was 1000 W on the upper side and 25 W on the lower side; the etching gas flow rates of chlorine and tetrafluoromethane were each 40 sccm; and the substrate temperature was −10° C. (see FIG. 12A).

The oxide semiconductor layer 158c to be the oxide semiconductor layer 108c was formed to a thickness of 5 nm by a sputtering method using a target of In:Ga:Zn=1:3:2 (see FIG. 12B). The oxide semiconductor layer 108c was formed under the following conditions: the pressure in a chamber was 0.7 Pa; a DC power source was used and the power was 0.5 kW; the sputtering gas flow rate of an oxygen gas was 45 sccm; the distance between the sample and the target was 60 mm; and the substrate heating temperature was 130° C.

As the insulating layer 115b to be the insulating layer 114, a silicon oxynitride film was formed by a plasma CVD method. The silicon oxynitride film was formed to a thickness of 10 nm under the following conditions: the deposition gas flow rates of silane and dinitrogen monoxide were 1 sccm and 800 sccm, respectively; the pressure in a chamber was controlled to be 200 Pa using a diaphragm-type baratron sensor and an APC valve; the RF power frequency was 60 MHz; the power was 150 W; the distance between electrodes was 28 mm; and the substrate heating temperature was 350° C.

As for the conductive layer 167b to be the conductive layer 116, a 5-nm-thick titanium nitride film formed by an ALD method and a 250-nm-thick tungsten film formed by a metal CVD method were formed.

The titanium nitride film was formed under the following conditions: titanium tetrachloride was introduced at 50 sccm for 0.05 seconds and adsorbed on the gate insulating layer; a nitrogen gas was introduced at 4500 sccm for 0.2 seconds and purging was performed; an ammonia gas was introduced at 2700 sccm for 0.3 seconds and adsorbed on the gate insulating layer; and a nitrogen gas was introduced at 4000 sccm for 0.3 seconds. These steps were regarded as one cycle, and the film thickness was controlled by changing the number of cycles. Furthermore, the substrate stage temperature was 412° C., the pressure was 667 Pa, and the distance between the substrate stage and the gas injection stage was 3 mm.

A 41-nm-thick tungsten film was deposited in 15 sec under the following conditions: the deposition gas flow rate of tungsten hexafluoride was 250 sccm and the deposition gas flow rates of hydrogen were 2200 sccm and 1700 sccm (for two gas lines), the deposition gas flow rate of argon was 2000 sccm, the deposition gas flow rate of nitrogen was 200 sccm, and the deposition gas flow rate of argon for the rear side of the stage was 4000 sccm, the pressure in a chamber was 10666 Pa, and the temperature of the substrate stage was 390° C.

Figure 12C:
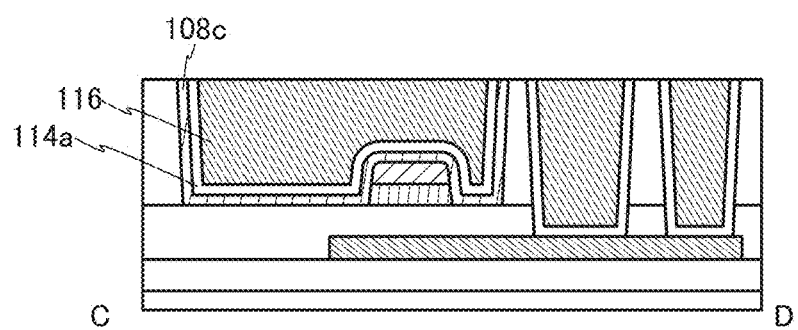

After the deposition of the titanium nitride film and the tungsten film, planarization treatment was performed by a CMP method until the silicon oxynitride film was exposed (see FIG. 12C).

Next, after the insulating layer 120, the insulating layer 122, and the insulating layer 124 are formed, the conductive layer 126a, the conductive layer 126b, the conductive layer 126c, the conductive layer 126d, the conductive layer 130a, the conductive layer 130b, the conductive layer 130c, and the conductive layer 130d are formed. The above is the manufacturing method of the sample.

Figure 20A:
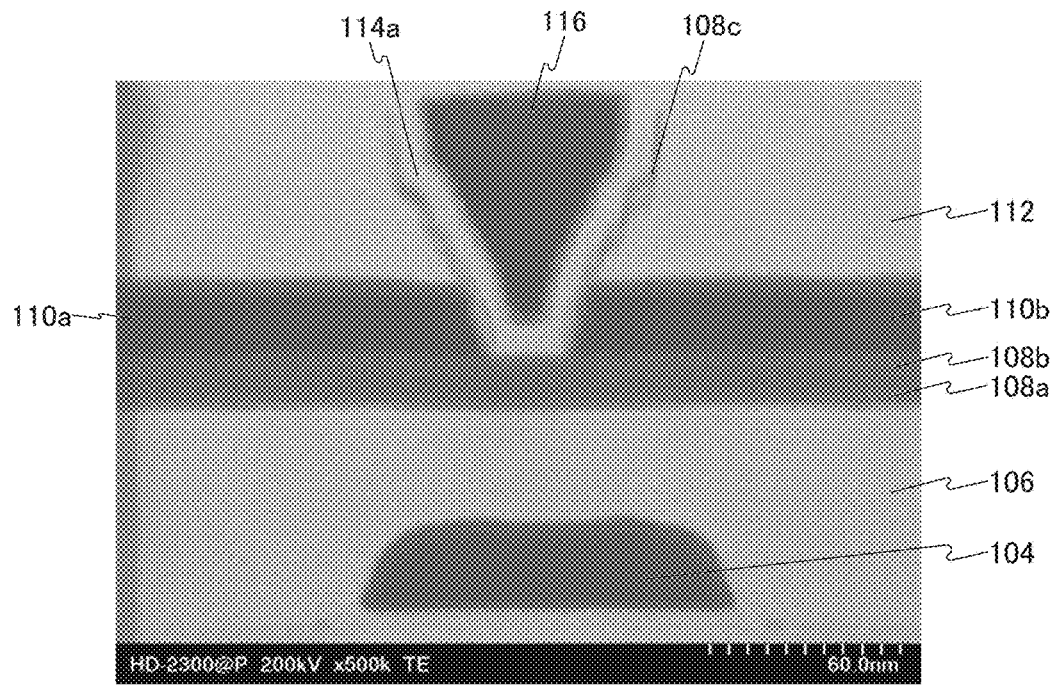
FIGS. 20A and 20B are each an image showing a sample.
Figure 20B:
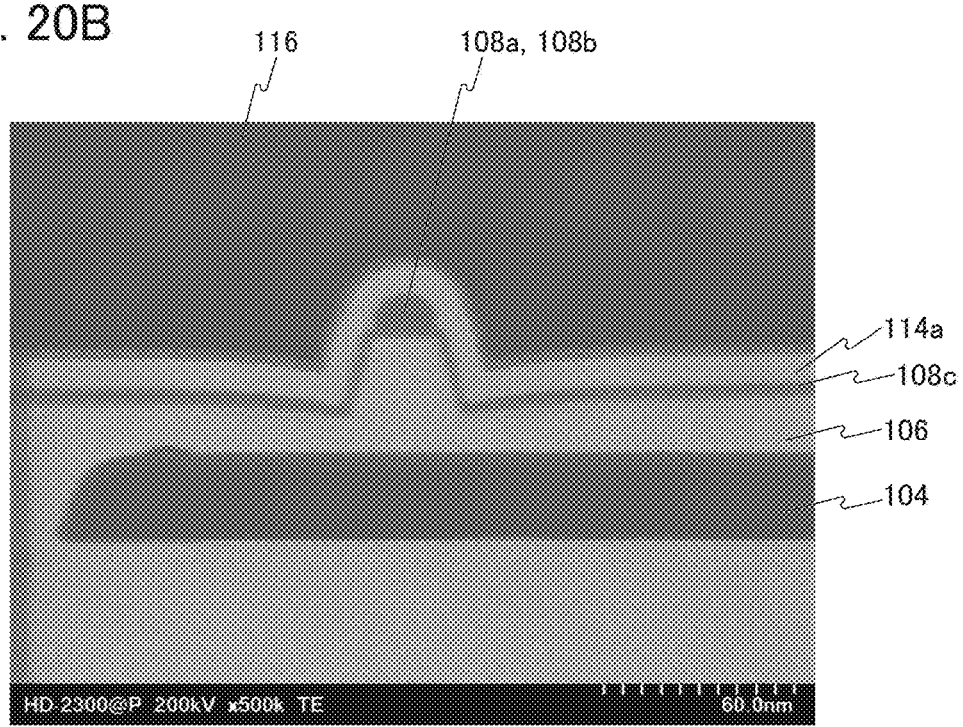
Figure 21A:
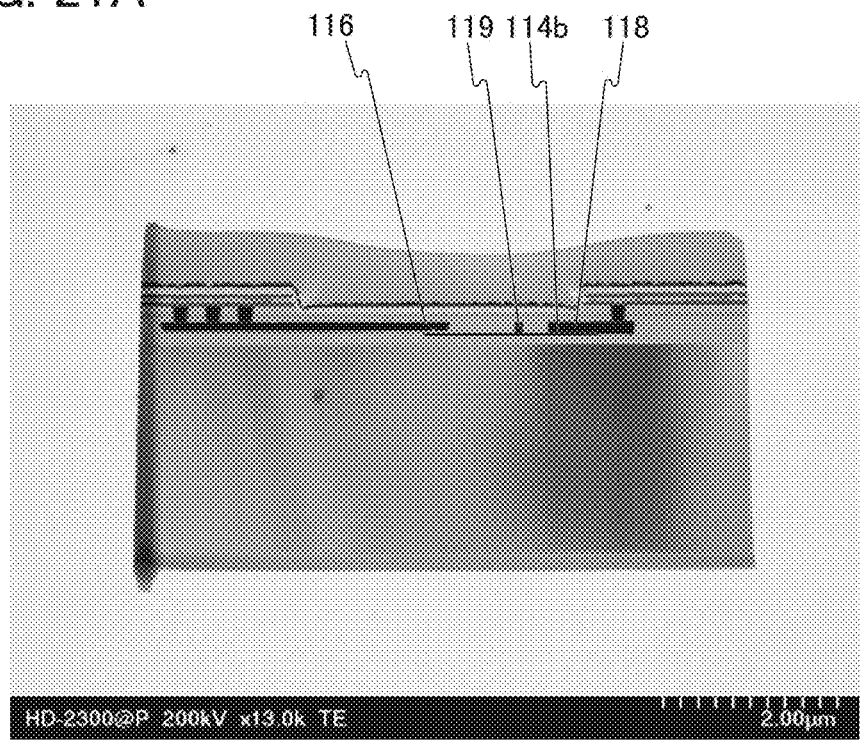
FIGS. 21A and 21B are each an image showing a sample.
Figure 21B:
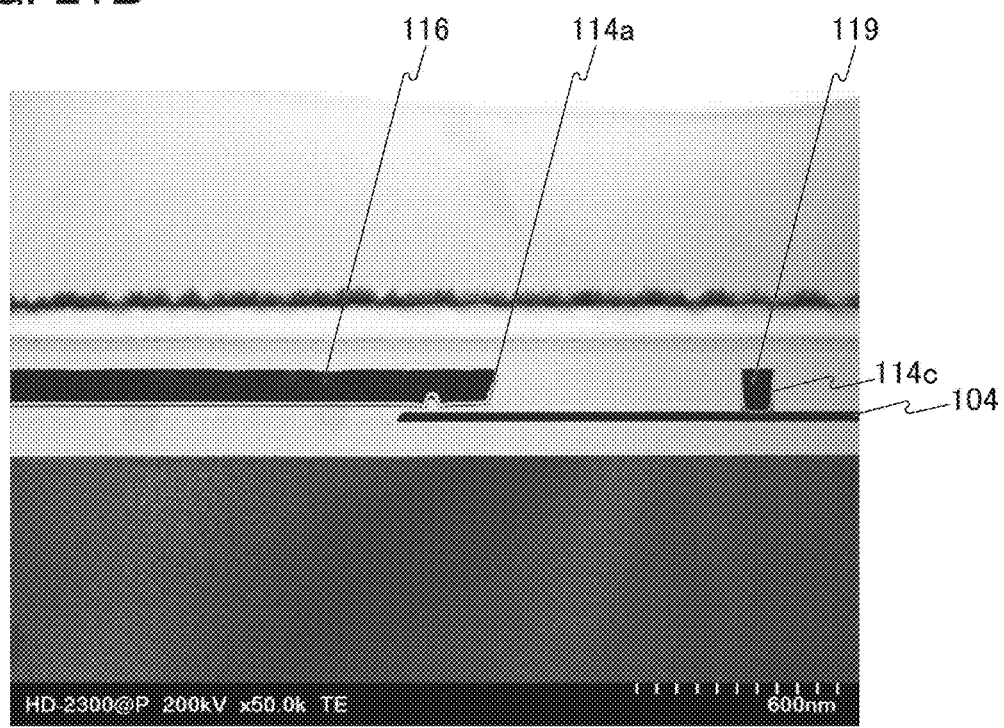

The fabricated sample was observed by scanning transmittance electron microscopy (STEM) using HD-2300 produced by Hitachi High-Technologies Corporation. FIGS. 20A and 20B and FIGS. 21A and 21B show cross-sectional STEM observation results of the sample. FIG. 20A shows cross-sectional STEM observation results in a direction corresponding to a cross-sectional view shown in FIG. 9B, for example. FIG. 20B and FIGS. 21A and 21B show cross-sectional STEM observation results in a direction corresponding to a cross-sectional view shown in FIG. 9C, for example.

According to FIGS. 20A and 20B and FIGS. 21A and 21B, the conductive layer 104, the insulating layer 106, the oxide semiconductor layer 108a, the oxide semiconductor layer 108b, the oxide semiconductor layer 108c, the conductive layer 110a, the conductive layer 110b, the insulating layer 112, the insulating layer 114a, the insulating layer 114b, the insulating layer 114c, the conductive layer 116, the conductive layer 118, and the conductive layer 119 are included in this example.

Note that the transistor in this example was fabricated in such a manner that an area of a region where the conductive layer 119 (second control gate) and the conductive layer 104 (floating gate) overlap is approximately $\frac{1}{10}$ of the size of an area of a region where the conductive layer 118 (first control gate) and the conductive layer 104 (floating gate) overlap.

Hereinafter, a potential of the conductive layer 118 is referred to as $V_{c1}$, a potential of the conductive layer 119 is referred to as $V_{c2}$, a potential of the conductive layer 116 is referred to as $V_g$, a potential of one of the conductive layers 110a and 110b is referred to as $V_s$, and the potential of the other one is referred to as $V_d$. Furthermore, a current flowing between one of the conductive layers 110a and 110b and the conductive layer 116 is referred to as $I_{ds}$, and a potential difference between one of the conductive layers 110a and 110b and the conductive layer 116 is referred to as $V_{ds}$.

Figure 22:
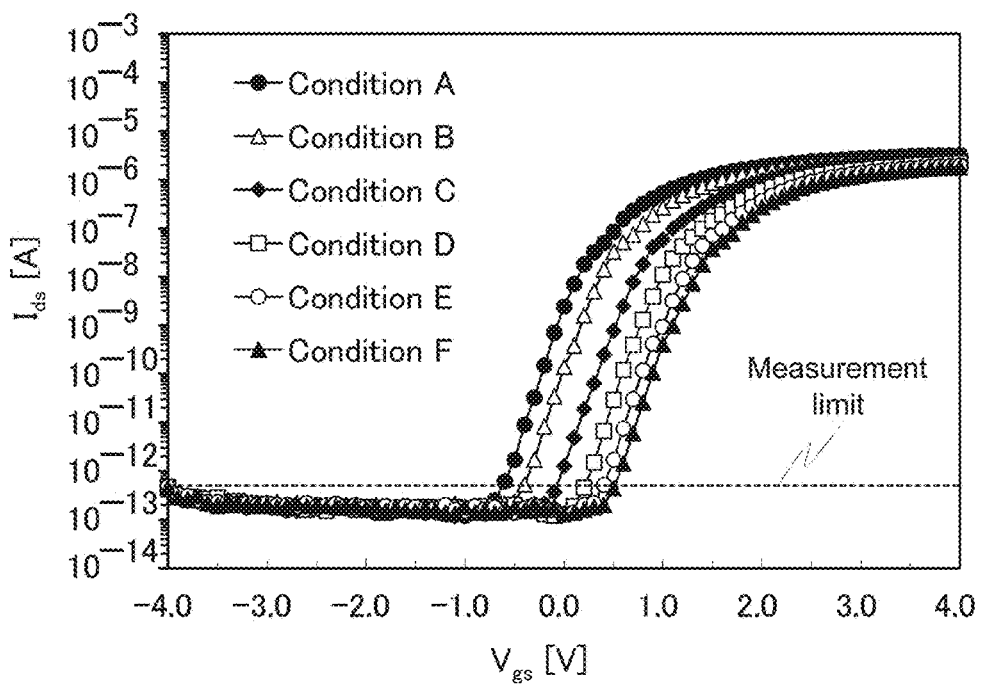
FIG. 22 is a diagram describing a sample.

FIG. 22 shows the $I_{ds}$-$V_{gs}$ characteristics of the sample measured under the conditions A to F.

Measurement under the condition A was performed at $V_{c1}$=0 V, $V_{c2}$=0 V, and $V_{ds}$=1.2 V.

Measurement under the condition B was performed at $V_{C1}$=0 V, $V_{C2}$=0 V, and $V_{ds}$=1.2 V after the measurement under the condition A and after conditions were kept for 500 μs at $V_{C1}$=16 V, $V_{C2}$=0 V, $V_s$=0 V, $V_d$=0 V, and $V_g$=0 V.

Measurement under the condition C was performed at $V_{C1}$=0 V, $V_{C2}$=0 V, and $V_{ds}$=1.2 V after the measurement under the condition B and after conditions were kept for 500 μs at $V_{C1}$=18 V, $V_{C2}$=0 V, $V_s$=0 V, $V_d$=0 V, and $V_g$=0 V.

Measurement under the condition D was performed at $V_{C1}$=0 V, $V_{C2}$=0 V, and $V_{ds}$=1.2 V after the measurement under the condition C and after conditions were kept for 500 µs at $V_{C1}$=20 V, $V_{C2}$=0 V, $V_s$=0 V, $V_d$=0 V, and $V_g$=0 V.

Measurement under the condition E was performed at $V_{C1}$=0 V, $V_{C2}$=0 V, and $V_{ds}$=1.2 V after the measurement under the condition D and after conditions were kept for 500 µs at $V_{C1}$=22 V, $V_{C2}$=0 V, $V_s$=0 V, $V_d$=0 V, and $V_g$=0 V.

Measurement under the condition F was performed at $V_{C1}$=0 V, $V_{C2}$=0 V, and $V_{ds}$=1.2 V after the measurement under the condition E and after conditions were kept for 500 µs at $V_{C1}$=24 V, $V_{C2}$=0 V, $V_s$=0 V, $V_d$=0 V, and $V_g$=0.

From FIG. 22, it is found that the threshold voltage of the transistor is continuously shifting in the positive direction under conditions A to F. Thus, it is found that the threshold voltage of the transistor can be changed by applying a voltage to the conductive layer 118 (first control gate).

This application is based on Japanese Patent Application Serial No. 2016-120670 filed with Japan Patent Office on Jun. 17, 2016, the entire contents of which are hereby incorporated by reference.

What is claimed is:

1. A transistor comprising:
a first conductive layer over a substrate, the first conductive layer functioning as a floating gate;
a first insulating layer and a second insulating layer over the first conductive layer;
a semiconductor layer over the first insulating layer;
a third insulating layer over the semiconductor layer and the first conductive layer;
a second conductive layer over the second insulating layer, the second conductive layer functioning as a control gate; and
a third conductive layer over the third insulating layer, the third conductive layer functioning as a gate electrode,
wherein the first conductive layer comprises:
a first region overlapping with the semiconductor layer with the first insulating layer therebetween;
a second region overlapping with the second conductive layer with the second insulating layer therebetween in a channel width direction; and
a third region overlapping with the third conductive layer with the third insulating layer therebetween,
wherein a thickness of the first insulating layer is larger than a thickness of the second insulating layer, and
wherein the second conductive layer does not overlap with the semiconductor layer and the third conductive layer in a top view.

2. The transistor according to claim 1, wherein the first conductive layer is in an electrically floating state.

3. The transistor according to claim 1, wherein the thickness of the first insulating layer is larger than a thickness of the third insulating layer.

4. The transistor according to claim 1, wherein the semiconductor layer comprises an oxide semiconductor.

5. The transistor according to claim 1, further comprising:
a fourth insulating layer over the first insulating layer; and
a fourth conductive layer over the fourth insulating layer.

6. The transistor according to claim 5, wherein the thickness of the first insulating layer is larger than a thickness of the fourth insulating layer.

7. An electronic device comprising the transistor according to claim 1.

8. A transistor comprising:
a first conductive layer over a substrate, the first conductive layer functioning as a floating gate;
a first insulating layer and a second insulating layer over the first conductive layer;
a semiconductor layer over the first insulating layer;
a third insulating layer over the semiconductor layer and the first conductive layer;
a second conductive layer over the second insulating layer, the second conductive layer functioning as a control gate; and
a third conductive layer over the third insulating layer, the third conductive layer functioning as a gate electrode,
wherein the first conductive layer comprises:
a first region overlapping with the semiconductor layer with the first insulating layer therebetween;
a second region overlapping with the second conductive layer with the second insulating layer therebetween in a channel width direction; and
a third region overlapping with the third conductive layer with the third insulating layer therebetween,
wherein a thickness of the first insulating layer is larger than a thickness of the second insulating layer,
wherein the second conductive layer does not overlap with the semiconductor layer and the third conductive layer in a top view, and
wherein the first conductive layer is configured to be injected with a charge by applying a voltage between the second conductive layer and the third conductive layer.

9. The transistor according to claim 8, wherein the first conductive layer is in an electrically floating state.

10. The transistor according to claim 8, wherein the thickness of the first insulating layer is larger than a thickness of the third insulating layer.

11. The transistor according to claim8, wherein the semiconductor layer comprises an oxide semiconductor.

12. The transistor according to claim 8, further comprising:
a fourth insulating layer over the first insulating layer; and
a fourth conductive layer over the fourth insulating layer.

13. The transistor according to claim 12, wherein the thickness of the first insulating layer is larger than a thickness of the fourth insulating layer.

14. An electronic device comprising the transistor according to claim 8.

* * * * *